(12) United States Patent
Kornbluh et al.

(10) Patent No.: US 7,211,937 B2
(45) Date of Patent: May 1, 2007

(54) ELECTROACTIVE POLYMER ANIMATED DEVICES

(75) Inventors: Roy D. Kornbluh, Palo Alto, CA (US);
Ronald E. Pelrine, Louisville, CO (US); Qibing Pei, Temecula, CA (US); Joseph S. Eckerle, Redwood City, CA (US)

(73) Assignee: SRI International, Menlo Park, CA (US)

( * ) Notice: Subject to any disclaimer, the term of this patent is extended or adjusted under 35 U.S.C. 154(b) by 0 days.

(21) Appl. No.: 11/411,007

(22) Filed: Apr. 24, 2006

(65) Prior Publication Data

US 2006/0290241 A1    Dec. 28, 2006

Related U.S. Application Data

(63) Continuation of application No. 10/393,506, filed on Mar. 18, 2003, now Pat. No. 7,064,472, and a continuation-in-part of application No. 09/792,431, filed on Feb. 23, 2001, now Pat. No. 6,628,040, said application No. 10/393,506 is a continuation-in-part of application No. 10/154,449, filed on May 21, 2002, now Pat. No. 6,891,317, said application No. 10/393,506 is a continuation-in-part of application No. 10/053,511, filed on Jan. 16, 2002, now Pat. No. 6,882,086, said application No. 10/393,506 is a continuation-in-part of application No. 09/619,847, filed on Jul. 20, 2000, now Pat. No. 6,812,624, said application No. 10/393,506 is a continuation-in-part of application No. 10/007,705, filed on Dec. 6, 2001, now Pat. No. 6,809,462, and a continuation-in-part of application No. 09/828,496, filed on Apr. 4, 2001, now Pat. No. 6,586,859, said application No. 10/393,506 is a continuation-in-part of application No. 10/066,407, filed on Jan. 31, 2002, now Pat. No. 7,052,594, and a continuation-in-part of application No. 09/779,203, filed on Feb. 7, 2001, now Pat. No. 6,664,718, said application No. 10/393,506 is a continuation-in-part of application No. 10/090,430, filed on Feb. 28, 2002, now Pat. No. 6,806,621.

(60) Provisional application No. 60/365,472, filed on Mar. 18, 2002, provisional application No. 60/184,217, filed on Feb. 23, 2000, provisional application No. 60/190,713, filed on Mar. 17, 2000, provisional application No. 60/293,003, filed on May 22, 2001, provisional application No. 60/293,005, filed on May 22, 2001, provisional application No. 60/327,846, filed on Oct. 5, 2001, provisional application No. 60/144,556, filed on Jul. 20, 1999, provisional application No. 60/153,329, filed on Sep. 10, 1999, provisional application No. 60/161,325, filed on Oct. 25, 1999, provisional application No. 60/181,404, filed on Feb. 9, 2000, provisional application No. 60/187,809, filed on Mar. 8, 2000, provisional application No. 60/192,237, filed on Mar. 27, 2000, provisional application No. 60/184,217, filed on Feb. 23, 2000, provisional application No. 60/293,004, filed on May 22, 2001, provisional application No. 60/194,817, filed on Apr. 5, 2000, provisional application No. 60/181,404, filed on Feb. 9, 2000.

(51) Int. Cl.
*H01L 41/08* (2006.01)
(52) U.S. Cl. ..................... 310/800; 446/330
(58) Field of Classification Search ............ 310/309, 310/328, 800; 446/330
See application file for complete search history.

(56) References Cited

U.S. PATENT DOCUMENTS

| | | | |
|---|---|---|---|
| 4,820,236 A * | 4/1989 | Berliner et al. ............ 446/369 |
| 4,885,783 A | 12/1989 | Whitehead et al. |
| 5,928,262 A | 7/1999 | Harber |
| 5,977,685 A | 11/1999 | Kurita et al. |
| 5,984,760 A | 11/1999 | Marine |
| 6,012,961 A | 1/2000 | Sharpe, III et al. |
| 6,048,622 A | 4/2000 | Hagood et al. |
| 6,060,811 A | 5/2000 | Fox et al. |

| | | |
|---|---|---|
| 6,084,321 A | 7/2000 | Hunter et al. |
| 6,093,078 A | 7/2000 | Cook |
| 6,181,351 B1 | 1/2001 | Merrill et al. |
| 6,184,608 B1 | 2/2001 | Cabuz et al. |
| 6,184,609 B1 | 2/2001 | Johansson et al. |
| 6,184,844 B1 | 2/2001 | Filipovic et al. |
| 6,249,076 B1 | 6/2001 | Madden et al. |
| 6,343,129 B1 | 1/2002 | Pelrine et al. |
| 6,379,393 B1 | 4/2002 | Mavroidis et al. |
| 6,545,384 B1 | 4/2003 | Pelrine et al. |
| 6,586,859 B2* | 7/2003 | Kornbluh et al. ........... 310/309 |
| 6,664,718 B2 | 12/2003 | Pelrine et al. |
| 6,902,048 B1* | 6/2005 | Chung ...................... 192/48.2 |
| 6,911,764 B2 | 6/2005 | Pelrine et al. |
| 2004/0008853 A1 | 1/2004 | Pelrine et al. |
| 2004/0249510 A1* | 12/2004 | Hanson ...................... 700/245 |
| 2006/0122954 A1* | 6/2006 | Podlasek et al. ............ 706/920 |

FOREIGN PATENT DOCUMENTS

| | | |
|---|---|---|
| DE | 4408618 A | 9/1995 |
| EP | 0295907 A1 | 6/1988 |
| JP | 63-97100 | 4/1988 |

OTHER PUBLICATIONS

Bar-Cohen, Yoseph, JPL, *WorldWide ElectroActive Polymers, EAP (Artificial Muscles) Newsletter*, vol. 3, No. 1, Jun. 2001.

Beckett, Jamie, "New Robotics Tap the Mind, Help the Heart,,SRI shows of latest technologies," San Francisco Chronicle, Aug. 27, 1998.

Biomimetic Products, Inc., http://www.biomimetic.com, no date.

Brock, D. L., "Review of Artificial Muscle based on Contractile Polymers," MIT Artificial Intelligence Laboratory, A.I. Memo No. 1330, Nov. 1991.

Caldwell, D., G. Medrano-Cerda, and M. Goodwin, "Characteristics and Adaptive Control of Pneumatic Muscle Actuators for a Robotic Elbow," Proc. IEEE Int. Conference on Robotics and Automation, San Diego, California (May 8-13, 1994).

De Rossi, D., and P. Chiarelli. 1994. "Biomimetic Macromolecular Actuators," *Macro-Ion Characterization, American Chemical Society Symposium Series*, vol. 548, Ch. 40, pp. 517-530.

Heydt, R., R. Kornbluh, R. Pelrine, and B. Mason, "Design and Performance of an Electrostrictive Polymer Film Acoustic Actuator", *Journal of Sound and Vibration* (1998)215(2), 297-311.

Heydt, R., R. Pelrine, J. Joseph, J. Eckerle, and R. Kornbluh. "Acoustical Performance of an Electrostrictive Polymer Film Loudspeaker", *Journal of the Acoustical Society of America* vol. 107, pp. 833-839 (Feb. 2000).

Hirose, S., Biologically Inspired Robots: Snake-like Locomotors and Manipulators, "*Development of the ACM as a Manipulator*", Oxford University Press, New York, 1993, pp. 170-172.

Jacobsen, S., Price, R., Wood, J, Rytting, T., and Rafaelof, M., "A Design Overview of an Eccentric-Motion Electrostatic Microactuator (the Wobble Motor)", *Sensors and Actuators*, 20 (1989) pp. 1-16.

Kornbluh, R. D and R. E. Pelrine., "Dexterous Multiarticulated Manipulator with Electrostrictive Polymer Artificial Muscle," ITAD-7247-QR-96-175, SRI Project No. 7247, Prepared for: Office of Naval Research, Nov. 1996.

Kornbluh, R., "Description of Children's Tour," Aug. 20, 2000.

Kornbluh, R., G. Andeen, and J. Eckerle, "Artificial Muscle: The Next Generation of Robotic Actuators," presented at the Fourth World Conference on Robotics Research, SME Paper M591-331, Pittsburgh, PA, Sep. 17-19, 1991.

Kornbluh, R., Pelrine, R. Joseph, J., Pei, Q. and Chiba, S., "Ultra-High Strain Response of Elastomeric Polymer Dielectrics", Proc. Materials Res. Soc., Fall meeting, Boston, MA, pp. 1-12, Dec. 1999.

Kornbluh, R., Pelrine, R., Eckerie, J., Joseph, J., "Electrostrictive Polymer Artificial Muscle Actuators", IEEE International Conference on Robotics and Automation, Leuven, Belgium, 1998.

Kornbluh, R., R. Pelrine, J. Joseph, "Elastomeric Dielectric Artificial Muscle Actuators for Small Robots," *Proceedings of the Third IASTED International Conference on Robotics and Manufacturing*, Jun. 14-16, 1995, Cancun, Mexico.

Kornbluh, R., R. Pelrine, Jose Joseph, Richard Heydt, Qibing Pei, Seiki Chiba, 1991. "High-Field Electrostriction Of Elastomeric Polymer Dielectrics For Actuation", Proceedings of the SPIE International Symposium on Smart Structures and Materials: Electro-Active Polymer Actuators and Devices, Mar. 1-2, 1999, Newport Beach, California, USA. pp. 149-161.

Kornbluh, R., R. Pelrine, Q. Pei, S. Oh, and J. Joseph, 2000. "Ultrahigh Strain Response of Field-Actuated Elastomeric Polymers," Proceedings of the 7th SPIE Symposium on Smart Structures and Materials-Electroactive Polymers and Devices (EAPAD) Conference, Mar. 6-8, 2000, Newport Beach, California, USA, pp. 51-64.

Kornbluh, Roy, "Use of Artificial Muscle Butterfly for Chronicle Newspaper Photograph," Aug. 1998.

Ktech's PVDF Sensors, http://www.ktech.com/pvdf.htm, Jun. 6, 2001, pp. 1-5.

Liu, Y., T. Zeng, Y.X. Wang, H. Yu, and R. Claus, "Self-Assembled Flexible Electrodes on Electroactive Polymer Actuators," Proceedings of the SPIE International Symposium on Smart Structures and Materials: Electro-Active Polymer Actuators and Devices, Mar. 1-2, 1999, Newport Beach, California, USA., pp. 284-288.

M. Greene and J. A. Willett, and Kornbluh, R., "Robotic systems," in ONR Report 32198-2, Ocean Engineering and Marine Systems 1997 Program (Dec. 1997).

Nguyen, T., Green, M., and Kornbluh, R., "Robotic Systems," in ONR Ocean, Atmosphere, and Space Fiscal Year 1999 Annual Reports (Dec. 1999).

Nguyen, T., J. A. Willett and Kornbluh, R., "Robotic systems," in ONR Ocean, Atmosphere, and Space Fiscal Year 1998 Annual Reports (Dec. 1998).

Pei et al., "Improved Electroactive Polymers", U.S. Appl. No. 09/619,847, filed Jul. 20, 2000, 70 pages.

Pei, Q., Pelrine, R., Kornbluh, R., Jonasdottir, S., Shastri, V., Full, R., "Multifunctional Electroelastomers: Electractive Polymers Combining Structural, Actuating, and Sensing Functions," available at www.sri.com- publications, Jan. 17, 2001.

Pelrine, R, R. Kornbluh, J. Joseph, and S. Chiba, "Electrostriction of Polymer Films for Microactuators," *Proc. IEEE Tenth Annual International Workshop on Micro Electro Mechanical Systems*, Nagoya, Japan, Jan. 26-30, 1997, pp. 238-243.

Pelrine, R., and J. Joseph, *FY 1992 Final Report on Artificial Muscle for Small Robots*, ITAD-3393-FR-93-063, SRI International, Menlo Park, California, Mar. 1993.

Pelrine, R., and J. Joseph. 1994. *FY 1993 Final Report on Artificial Muscle for Small Robots*, ITAD-4570-FR-94-076, SRI International, Menlo Park, California.

Pelrine, R., J. Eckerle, and S. Chiba, "Review of Artificial Muscle Approaches," invited paper, in *Proc. Third International Symposium on Micro Machine and Human Science*, Nagoya, Japan, Oct. 14-16, 1992.

Pelrine, R., R. Kornbluh, and J. Joseph, FY 1996 *Final Report on Artificial Muscle for Small Robots*, ITAD-7228-FR-97-058, SRI International, Menlo Park, California, 1997.

Pelrine, R., R. Kornbluh, and J. Joseph, FY 1997 *Final Report on Artificial Muscle for Small Robots*, ITAD-1612-FR-98-041, SRI International, Menlo Park, California, 1998.

Pelrine, R., R. Kornbluh, and J. Joseph, FY 1998 *Final Report on Artificial Muscle for Small Robots*, ITAD-3482-FR-99-36, SRI International, Menlo Park, California, 1999.

Pelrine, R., R. Kornbluh, and J. Joseph, FY 1999 *Final Report on Artificial Muscle for Small Robots*, ITAD-10162-FR-00-27, SRI International, Menlo Park, California, 2000.

Pelrine, R., R. Kornbluh, and J. Joseph, "Electrostriction of Polymer Dielectrics with Compliant Electrodes as a Means of Actuation," *Sensors and Actuators A: Physical*, vol. 64, 1998, pp. 77-85.

Pelrine, R., R. Kornbluh, and J. Joseph, *FY 1994 Final Report on Artificial Muscle for Small Robots*, ITAD-5782-FR-95-050, SRI International, Menlo Park, California, 1995.

Pelrine, R., R. Kornbluh, and J. Joseph, *FY 1995 Final Report on Artificial Muscle for Small Robots*, ITAD-7071 -FR-96-047, SRI International, Menlo Park, California, 1996.

Pelrine, R., R. Kornbluh, Q. Pei, and J. Joseph. "High-Speed Electrically Actuated Elastomers with Strain Greater Than 100%", *Science*, Reprint Series, Feb. 4, 2000, vol. 287, pp. 836-839.

Pelrine, R., Roy Kornbluh, Jose Joseph, Qibing Pei, Seiki Chiba "Recent Progress in Artificial Muscle Micro Actuators," , SRI International, Tokyo, 1999 MITI/NEEDOIMNIC, 1999.

Piezoflex™ PVDF Polymer Sensors, http://www.airmar.com/piezo/pvdf.htm, Jun. 6, 2001.

R. Pelrine and Kornbluh, R., and. 1995. *"Dexterous Multiarticulated Manipulator with Electrostrictive Polymer Artificial Muscle Actuator,"* EMU 95-023, SRI International, Menlo Park, California, Apr. 28, 1995.

Smela, E., O. Inganäs, Q. Pei, and I. Lundström, "Electrochemical Muscles: Micromachining Fingers and Corkscrews," *Advanced Materials*, vol. 5, No. 9, pp. 630-632, Sep. 1993.

T.B. Nguyen, M. Green and R. Kornbluh, "Robotic Systems," in ONR Ocean, Atmosphere, and Space Fiscal Year 2000 Annual Reports (Jan. 2001).

Technology, http://www.micromuscle.com/html/technology.html, Jun. 6, 2001.

Winters, J., "Muscle as an Actuator for Intelligent Robots", Robotics Research: Trans. Robotics International of SME, Scottsdale, AZ (Aug. 18-21, 1986).

* cited by examiner

*Primary Examiner*—Thomas M. Dougherty
(74) *Attorney, Agent, or Firm*—Beyer Weaver LLP

(57) ABSTRACT

The present invention relates to animated devices that include one or more electroactive polymer transducers. When actuated by electrical energy, an electroactive polymer produces mechanical deflection in one or more directions. This deflection may be used to produce motion of a feature included in an animated device. Electroactive polymer transducers offer customizable shapes and deflections. Combining different ways to configure and constrain a polymer, different ways to arrange active areas on a single polymer, different animated device designs, and different polymer orientations, permits a broad range of animated devices that use an electroactive polymer transducer to produce motion. These animated devices find use in a wide range of animated device applications.

20 Claims, 17 Drawing Sheets

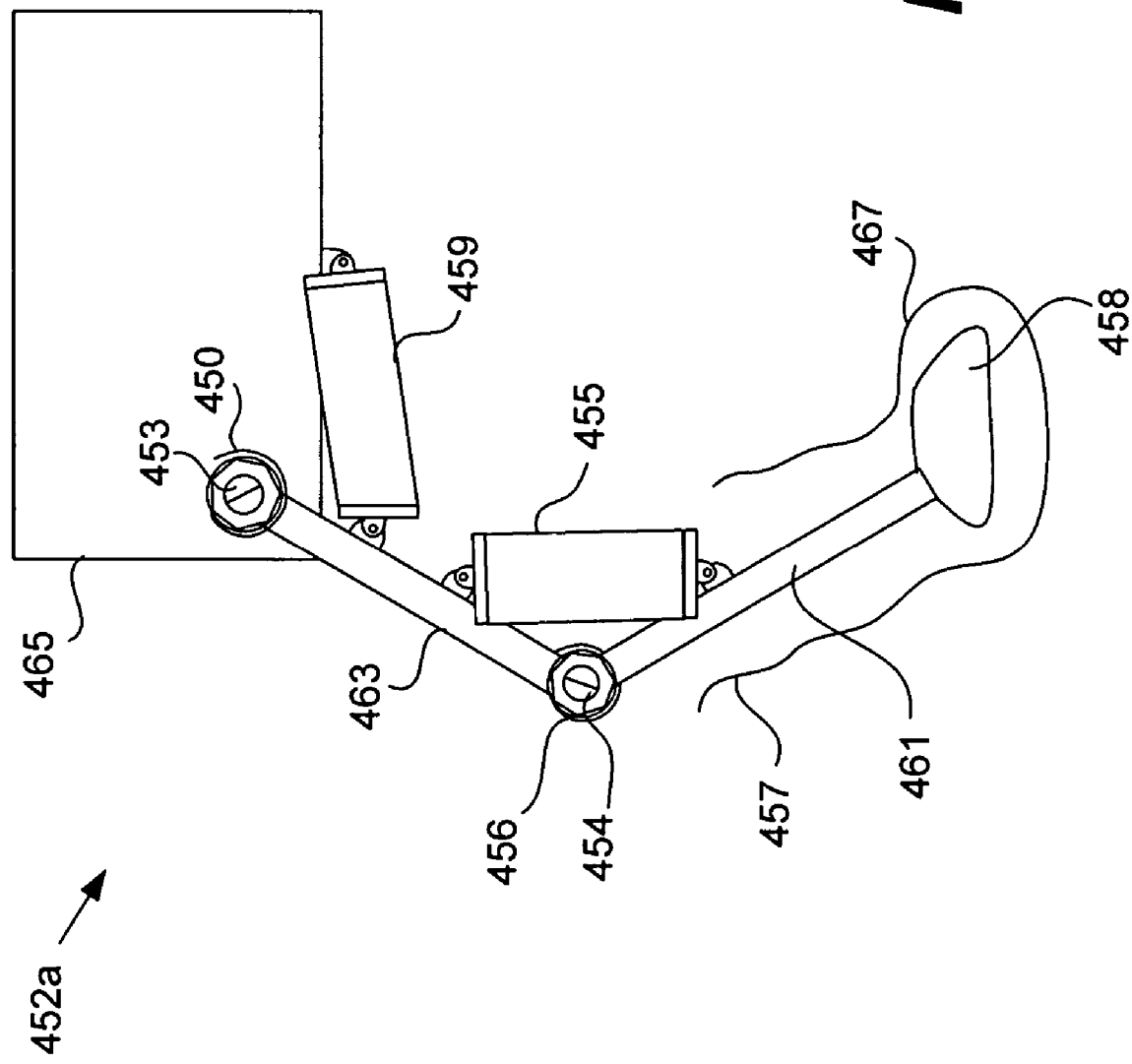

ELECTROACTIVE POLYMER ANIMATED DEVICES

CROSS-REFERENCE TO RELATED APPLICATIONS

This application claims priority under U.S.C. §120 from co-pending U.S. patent application Ser. No. 10/393,506, filed Mar. 18, 2003 and entitled, "Electroactive Polymer Devices for Moving Fluid";

this '506 patent application is incorporated herein for all purposes and claims priority under 35 U.S.C. §119(e) from U.S. Provisional Patent Application No. 60/365,472, by Pelrine et al., "Electroactive Polymer Devices For Moving Fluid," filed Mar. 18, 2002 which is incorporated by reference for all purposes;

and the '506 patent application is a continuation-in-part and claims priority from U.S. patent application Ser. No. 09/792,431, now U.S. Pat. No. 6,628,040 entitled "Electroactive Polymer Thermal Electric Generators," filed Feb. 23, 2001, which is incorporated herein by reference in its entirety for all purposes and which claims priority under 35 U.S.C. §119(e) from a) U.S. Provisional Patent Application No. 60/184,217 filed Feb. 23, 2000, naming Q. Pei et al. as inventors, and titled "Electroelastomers and Their Use For Power Generation", which is incorporated by reference herein for all purposes and which also claims priority under 35 U.S.C. § 119(e) from b) U.S. Provisional Patent Application No. 60/190,713 filed Mar. 17, 2000, naming J. S. Eckerle et al. as inventors, and titled "Artificial Muscle Generator", which is incorporated by reference herein for all purposes;

and the '506 patent application is a continuation-in-part and claims priority from U.S. patent application Ser. No. 10/154,449, now U.S. Pat. No. 6,891,317 entitled "Rolled Electroactive Polymers," filed May 21, 2002, which is incorporated herein by reference in its entirety for all purposes which claims priority under 35 U.S.C. §119(e) from U.S. Provisional Patent Application No. 60/293,003 filed on May 22, 2001, which is also incorporated by reference for all purposes;

and the '506 patent application is a continuation-in-part and claims priority from U.S. patent application Ser. No. 10/053,511, now U.S. Pat. No. 6,882,086 entitled "Variable Stiffness Electroactive Polymer Systems," filed Jan. 16, 2002 which is incorporated herein by reference in its entirety for all purposes which claims priority a) under 35 U.S.C. §119(e) from U.S. Provisional Patent Application No. 60/293,005 filed May 22, 2001, which is incorporated by reference herein for all purposes; and which claims priority b) under 35 U.S.C. §119(e) from U.S. Provisional Patent Application No. 60/327,846 entitled Enhanced Multifunctional Footwear and filed Oct. 5, 2001, which is also incorporated by reference herein for all purposes;

and the '506 patent application is a continuation-in-part and claims priority from U.S. patent application Ser. No. 09/619,847, now U.S. Pat. No. 6,812,624 entitled "Improved Electroactive Polymers," filed Jul. 20, 2000 which is incorporated herein by reference in its entirety for all purposes which claims priority a) under 35 U.S.C. §119(e) from U.S. Provisional Patent Application No. 60/144,556 filed Jul. 20, 1999, naming R. E. Pelrine et al. as inventors, and titled "High-speed Electrically Actuated Polymers and Method of Use", which is incorporated by reference herein for all purposes and which claims priority b) under 35 U.S.C. §119(e) from U.S. Provisional Patent Application No. 60/153,329 filed Sep. 10, 1999, naming R. E. Pelrine et al. as inventors, and titled "Electrostrictive Polymers As Microactuators", which is incorporated by reference herein for all purposes and which claims priority c) under 35 U.S.C. §119(e) from U.S. Provisional Patent Application No. 60/161,325 filed Oct. 25, 1999, naming R. E. Pelrine et al. as inventors, and titled "Artificial Muscle Microactuators", which is incorporated by reference herein for all purposes and which claims priority d) under 35 U.S.C. §119(e) from U.S. Provisional Patent Application No. 60/181,404 filed Feb. 9, 2000, naming R. D. Kornbluh et al. as inventors, and titled "Field Actuated Elastomeric Polymers", which is incorporated by reference herein for all purposes and which claims priority (e) under 35 U.S.C. §119(e) from U.S. Provisional Patent Application No. 60/187,809 filed Mar. 8, 2000, naming R. E. Pelrine et al. as inventors, and titled "Polymer Actuators and Materials", which is incorporated by reference herein for all purposes; and which claims priority f) under 35 U.S.C. §119(e) from U.S. Provisional Patent Application No. 60/192,237 filed Mar. 27, 2000, naming R. D. Kornbluh et al. as inventors, and titled "Polymer Actuators and Materials II", which is incorporated by reference herein for all purposes and which claims priority g) under 35 U.S.C. §119(e) from U.S. Provisional Patent Application No. 60/184,217 filed Feb. 23, 2000, naming R. E. Pelrine et al. as inventors, and titled "Electroelastomers and their use for Power Generation", which is incorporated by reference herein for all purposes;

and the '506 patent application is a continuation-in-part and claims priority from U.S. patent application Ser. No. 10/007,705, now U.S. Pat. No. 6,809,462 entitled "Electroactive Polymer Sensors," filed Dec. 6, 2001, which claims priority under 35 U.S.C. §119(e) from U.S. Provisional Patent Application No. 60/293,004 filed May 22, 2001, which is incorporated by reference herein for all purposes and which is also a continuation in part of U.S. patent application Ser. No. 09/828,496, now U.S. Pat. No. 6,586,859, which claims priority from U.S. Provisional Application No. 60/194,817 filed Apr. 5, 2000, all of which are incorporated by reference herein for all purposes;

and the '506 patent application is a continuation-in-part and claims priority from co-pending U.S. patent application Ser. No. 10/066,407 entitled "Devices and Methods for Controlling Fluid Flow Using Elastic Sheet Deflection," filed Jan. 31, 2002, which is incorporated by reference herein for all purposes and the '506 patent application is a continuation-in-part and claims priority from U.S. patent application Ser. No. 09/779,203, now U.S. Pat. No. 6,664,718, filed Feb. 7, 2001, by Pelrine et al., and entitled, "Monolithic Electroactive Polymers," which claims priority under 35 U.S.C. §119(e) from U.S. Provisional Patent Application No. 60/181,404, which is incorporated by reference for all purposes and the '506 patent application is a continuation-in-part and claims priority from U.S. patent application Ser. No. 10/090,430, now U.S. Pat. No. 6,806,621, filed on Feb. 28, 2002, by Heim et al. and titled, "Electroactive Polymer Rotary Motors," which claims priority under 35 U.S.C. §119(e) from U.S. Provisional Patent Application No. 60/273,108, filed Mar. 2, 2001 and titled, "Electroactive Polymer Motors," both of which are incorporated by reference for all purposes.

U.S. GOVERNMENT RIGHTS

This application was made in part with government support awarded by the Office of Naval Research under contract numbers N00014-96-C-0026, N00014-97-C-0352, N00014-02-C-0252 and N00174-99-C-0032; and by the Defense Advanced Research Projects Agency under contract number DABT63-98-C-0024. The government has certain rights in the invention.

FIELD OF THE INVENTION

The present invention relates generally to animated devices comprising one or more electroactive polymers. More particularly, the present invention relates to animated devices having motion powered by electroactive polymer transducers, and their use in various applications such as toys and animatronics.

BACKGROUND OF THE INVENTION

An animatronic device is an animated device with motion likeness of a human, creature, or animal. Conventional animatronic devices include animatronic puppets, robots, creatures, special effects make-up, scenic props, sets, etc. These devices find wide use in themed rides, dark walks, scenery, and special effects for the film and television industries.

Motion for an animatronic device is typically powered by an electric or mechanical source. The most common source of power for an animatronic device is electric motors such as AC, DC, servo, and stepper motors. Compressed air and pressurized hydraulic fluid are also used to power air and hydraulic motors in larger animatronic devices. Each of these forms of power has advantages and disadvantages that determines its usage.

AC and DC motors provide continuous rotary output, which is often not suitable for simple animatronic devices. For example, a simple animatronic device may require a lead screw and other mechanical assistance to convert continuous rotary output of a motor into simple linear motion. AC motors provide continuous rotary motion but are limited to a few speeds that are a function of the AC line frequency, e.g., 1800 and 3600 rpm based on 60 Hz in the U.S. If other outputs speeds are desired for an animatronic device, a gearbox speed reducer is required; thus further complicating the animatronic device. Servomotors are fast response, closed loop control motors capable of providing programmed motion. In addition to the above rotary to linear complications, these devices are also very expensive. Unlike servomotors, stepper motors are open loop, meaning they receive no feedback as to whether the output device has responded as requested. While being relatively good at holding an output in one position, stepper motors often are poor with motion, get out of phase with a desired control, moderately expensive, require special controllers, and thus not ideal for many animatronic devices.

Air and hydraulic motors have more limited application in animatronics than electric motors since they require the availability of a compressed air or hydraulic source. The additional weight, complexity and relative inefficiency of the power source makes these devices unsuitable for many animatronic applications, particularly for small mobile devices, since extremely small compressors and valves are currently unobtainable. Although individual air motors and air cylinders are relatively cheap, these pneumatic systems are also quite expensive when the cost of all the ancillary equipment is considered.

In addition to the specific drawbacks discussed with respect to each source of power, all of the above systems are generally heavy, bulky and not suitable for many applications where light weight and small size is desirable. Conventional electromagnetic technologies also typically do not have sufficient energy densities (the work output on a per volume or per mass basis) to construct many animatronic devices. The deficiency of many conventional devices is greater at small scales. As electromagnetic devices are scaled-down in size, their efficiency decreases. Further, the above technologies provide strict mechanical output. Many animatronic applications require a high degree of mobility or dexterity that is difficult to achieve with conventional actuation technologies.

In view of the foregoing, alternative devices that convert from an input energy to mechanical energy would be desirable.

SUMMARY OF THE INVENTION

The present invention relates to animated devices that comprise one or more polymer based transducers. When a voltage is applied to electrodes contacting an electroactive polymer, the polymer deflects. Deflection of the transducer may then be converted into motion of a feature included in an animated device. Electroactive polymer transducers enable complex and customized animatronic devices by overcoming many of the actuator limitations described above. In this application, electroactive polymer transducers represent a simple, light weight, customizable, and efficient replacement for conventional actuators in animatronic devices.

In one aspect, the present invention relates to an animated device. The device comprises a feature capable of motion between a first position and a second position. The animated device also comprises a transducer configured to provide at least a portion of the motion between the first position and the second position for the feature. The transducer comprises an active area, which includes at least two electrodes coupled to a portion of an electroactive polymer. The portion is capable of deflection in response to a change in electric field provided by the at least two electrodes.

In another aspect, the present invention relates to an animated face. The face comprises a facial feature capable of motion between a first position and a second position. The face also comprises a transducer configured to provide at least a portion of the motion between the first position and the second position for the facial feature. The transducer comprises an active area, which includes at least two electrodes coupled to a portion of an electroactive polymer. The portion capable of deflection in response to a change in electric field provided by the at least two electrodes.

In yet another aspect, the present invention relates to an animated toy. The toy has a feature capable of motion between a first position and a second position. The animated toy also comprises a transducer configured to provide at least a portion of the motion between the first position and the second position. The transducer comprising an active area, which includes at least two electrodes coupled to a portion of an electroactive polymer. The portion capable of deflection in response to a change in electric field provided by the at least two electrodes.

In still another aspect, the present invention relates to an animated skin. The animated skin comprises a feature capable of motion between a first position and a second position. The animated skin also comprises a transducer configured to provide at least a portion of the motion between the first position and the second position for the feature. The transducer comprises an active area, which includes at least two electrodes coupled to a portion of an electroactive polymer. The portion is capable of deflection in response to a change in electric field provided by the at least two electrodes.

In another aspect, the present invention relates to an animated device. The animated device has a feature capable of motion between a first position and a second position. The animated device comprises a transducer configured to provide at least a portion of the motion between the first position and the second position for the feature. The transducer comprises an active area, which includes at least two electrodes coupled to a portion of an electroactive polymer. The portion is capable of deflection in response to a change in electric field provided by the at least two electrodes. The animated device also comprises a sensor.

In yet another aspect, the present invention relates to an animated device. The animated device has a feature capable of motion between a first position and a second position. The animated device comprises a transducer configured to provide at least a portion of the motion between the first position and the second position for the feature. The transducer comprising an active area, which includes at least two electrodes coupled to a portion of an electroactive polymer, the portion capable of deflection in response to a change in electric field provided by the at least two electrodes. The animated device also capable of acoustic emission.

In still another aspect, the present invention relates to an animated device capable of surface based locomotion. The animated device has a feature capable of motion between a first position and a second position. The animated device comprises a transducer configured to provide at least a portion of the motion between the first position and the second position for the feature. The transducer comprises an active area, which includes at least two electrodes coupled to a portion of an electroactive polymer, the portion capable of deflection in response to a change in electric field provided by the at least two electrodes. The device is configured such that motion between the first position and the second position for the feature provides at least a portion of the surface based locomotion.

In another aspect, the present invention relates to a doll. The doll comprises a body comprising a torso having a pair of arms extending therefrom, a head, a pair of legs extending downwardly therefrom, a neck portion supporting the head. The doll also comprises a transducer configured to move a feature on the doll. The transducer comprises an active area, which includes at least two electrodes coupled to a portion of an electroactive polymer. The portion capable of deflection in response to a change in electric field provided by the at least two electrodes.

In yet another aspect, the present invention relates to an animated device having likeness of a human and a feature capable of motion between a first position and a second position. The animated device comprises a transducer configured to provide at least a portion of the motion between the first position and the second position for the feature. The transducer comprises an active area, which includes at least two electrodes coupled to a portion of an electroactive polymer. The portion capable of deflection in response to a change in electric field provided by the at least two electrodes. The feature has a human likeness.

These and other features and advantages of the present invention will be described in the following description of the invention and associated figures.

BRIEF DESCRIPTION OF THE DRAWINGS

FIG. 3H illustrates leg assembly for the toy dog of FIG. 3G in accordance with a specific embodiment of the present invention.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Overview

The present invention relates to animated devices that include one or more electroactive polymers. When actuated by electrical energy, an electroactive polymer produces mechanical deflection. Deflection of the electroactive polymer transducer may be used to produce motion of a feature of an animated device. The feature may be a leg or other body part included in an animated toy, for example. Electroactive polymer transducers offer customizable deflections by arranging one or more active areas on a single polymer and offer customizable shapes, e.g., rolls, diaphragms, etc. Multiple polymers may be included in a device by stacking or otherwise combining individual polymers. Combining different ways to arrange a polymer in a device, different polymer actuators, different ways to arrange active areas on a single polymer and different animated device designs, permits a broad range of animated devices that use an electroactive polymer to produce motion. These animated devices find use in a wide range of animated device applications.

As the term is used herein, an animated device refers to a device, figure or object that simulates motion of a living organism or a portion of an organism. Exemplary animated devices include animatronic devices, toys, masks, mannequins, displays, scenic and entertainment industry set decorations, novelty items. etc. Typically, the animated device is designed or configured to seem alive or moving or has some form of lifelike movement. In one embodiment, the devices are configured to simulate human actions and movements. This also includes non-living objects that simulate life-like characteristics, e.g., tea cups having actuated facial features that simulate talking. As mentioned above, an animatronic device is one class of animated device with motion likeness of a human, creature, or animal.

General Structure of Electroactive Polymers

The transformation between electrical and mechanical energy in devices of the present invention is based on energy conversion of one or more active areas of an electroactive polymer. Electroactive polymers are capable of converting between mechanical energy and electrical energy. In some cases, an electroactive polymer may change electrical properties (for example, capacitance and resistance) with changing mechanical strain.

Figure 1A:
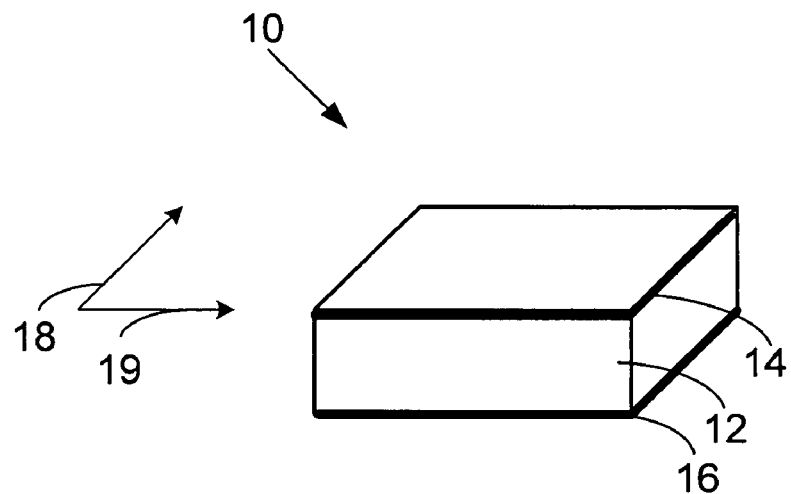
FIGS. 1A and 1B illustrate a top perspective view of a transducer before and after application of a voltage in accordance with one embodiment of the present invention.

To help illustrate the performance of an electroactive polymer in converting between electrical energy and mechanical energy, FIG. 1A illustrates a top perspective view of a transducer portion 10 in accordance with one embodiment of the present invention. The transducer portion 10 comprises a portion of an electroactive polymer 12 for converting between electrical energy and mechanical energy. In one embodiment, an electroactive polymer refers to a polymer that acts as an insulating dielectric between two electrodes and may deflect upon application of a voltage difference between the two electrodes (a 'dielectric elastomer'). Top and bottom electrodes 14 and 16 are attached to the electroactive polymer 12 on its top and bottom surfaces, respectively, to provide a voltage difference across polymer 12, or to receive electrical energy from the polymer 12. Polymer 12 may deflect with a change in electric field provided by the top and bottom electrodes 14 and 16. Deflection of the transducer portion 10 in response to a change in electric field provided by the electrodes 14 and 16 is referred to as 'actuation'. Actuation typically involves the conversion of electrical energy to mechanical energy. As polymer 12 changes in size, the deflection may be used to produce mechanical work.

Without wishing to be bound by any particular theory, in some embodiments, the polymer 12 may be considered to behave in an electrostrictive manner. The term electrostrictive is used here in a generic sense to describe the stress and strain response of a material to the square of an electric field. The term is often reserved to refer to the strain response of a material in an electric field that arises from field induced intra-molecular forces but we are using the term more generally to refer to other mechanisms that may result in a response to the square of the field. Electrostriction is distinguished from piezoelectric behavior in that the response is proportional to the square of the electric field, rather than proportional to the field. The electrostriction of a polymer with compliant electrodes may result from electrostatic forces generated between free charges on the electrodes (sometimes referred to as "Maxwell stress") and is proportional to the square of the electric field. The actual strain response in this case may be quite complicated depending on the internal and external forces on the polymer, but the electrostatic pressure and stresses are proportional to the square of the field.

Figure 1B:
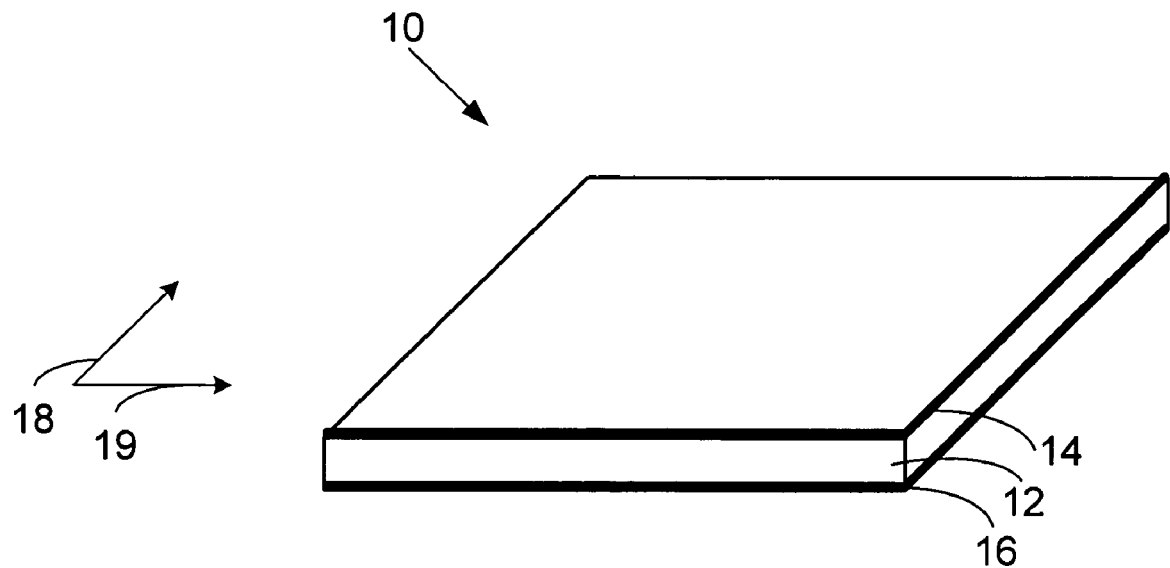

FIG. 1B illustrates a top perspective view of the transducer portion 10 including deflection. In general, deflection refers to any displacement, expansion, contraction, torsion, linear or area strain, or any other deformation of a portion of the polymer 12. For actuation, a change in electric field corresponding to the voltage difference applied to or by the electrodes 14 and 16 produces mechanical pressure within polymer 12. In this case, the unlike electrical charges produced by electrodes 14 and 16 attract each other and provide a compressive force between electrodes 14 and 16 and an expansion force on polymer 12 in planar directions 18 and 19, causing polymer 12 to compress between electrodes 14 and 16 and stretch in the planar directions 18 and 19.

Electrodes 14 and 16 are compliant and change shape with polymer 12. The configuration of polymer 12 and electrodes 14 and 16 provides for increasing polymer 12 response with deflection. More specifically, as the transducer portion 10 deflects, compression of polymer 12 brings the opposite charges of electrodes 14 and 16 closer and the stretching of polymer 12 separates similar charges in each electrode. In one embodiment, one of the electrodes 14 and 16 is ground. For actuation, the transducer portion 10 generally continues to deflect until mechanical forces balance the electrostatic forces driving the deflection. The mechanical forces include elastic restoring forces of the polymer 12 material, the compliance of electrodes 14 and 16, and any external resistance provided by a device and/or load coupled to the transducer portion 10, etc. The deflection of the transducer portion 10 as a result of an applied voltage may also depend on a number of other factors such as the polymer 12 dielectric constant and the size of polymer 12.

Electroactive polymers in accordance with the present invention are capable of deflection in any direction. After application of a voltage between the electrodes 14 and 16, the electroactive polymer 12 increases in size in both planar directions 18 and 19. In some cases, the electroactive polymer 12 is incompressible, e.g. has a substantially constant volume under stress. In this case, the polymer 12 decreases in thickness as a result of the expansion in the planar directions 18 and 19. It should be noted that the present invention is not limited to incompressible polymers and deflection of the polymer 12 may not conform to such a simple relationship.

Application of a relatively large voltage difference between electrodes 14 and 16 on the transducer portion 10 shown in FIG. 1A will cause transducer portion 10 to change to a thinner, larger area shape as shown in FIG. 1B. In this manner, the transducer portion 10 converts electrical energy to mechanical energy. The transducer portion 10 may also be used to convert mechanical energy to electrical energy.

For actuation, the transducer portion 10 generally continues to deflect until mechanical forces balance the electrostatic forces driving the deflection. The mechanical forces include elastic restoring forces of the polymer 12 material, the compliance of electrodes 14 and 16, and any external resistance provided by a device and/or load coupled to the transducer portion 10, etc. The deflection of the transducer portion 10 as a result of an applied voltage may also depend on a number of other factors such as the polymer 12 dielectric constant and the size of polymer 12.

In one embodiment, electroactive polymer 12 is pre-strained. Pre-strain of a polymer may be described, in one or more directions, as the change in dimension in a direction after pre-straining relative to the dimension in that direction before pre-straining. The pre-strain may comprise elastic deformation of polymer 12 and be formed, for example, by stretching the polymer in tension and fixing one or more of the edges while stretched. Alternatively, as will be described in greater detail below, a mechanism such as a spring may be coupled to different portions of an electroactive polymer and provide a force that strains a portion of the polymer. For many polymers, pre-strain improves conversion between electrical and mechanical energy. The improved mechanical response enables greater mechanical work for an electroactive polymer, e.g., larger deflections and actuation pressures. In one embodiment, prestrain improves the dielectric strength of the polymer. In another embodiment, the pre-strain is elastic. After actuation, an elastically pre-strained polymer could, in principle, be unfixed and return to its original state.

In one embodiment, pre-strain is applied uniformly over a portion of polymer 12 to produce an isotropic pre-strained polymer. By way of example, an acrylic elastomeric polymer may be stretched by 200 to 400 percent in both planar directions. In another embodiment, pre-strain is applied unequally in different directions for a portion of polymer 12 to produce an anisotropic pre-strained polymer. In this case, polymer 12 may deflect greater in one direction than another when actuated. While not wishing to be bound by theory, it is believed that pre-straining a polymer in one direction may increase the stiffness of the polymer in the pre-strain direction. Correspondingly, the polymer is relatively stiffer in the high pre-strain direction and more compliant in the low pre-strain direction and, upon actuation, more deflection occurs in the low pre-strain direction. In one embodiment, the deflection in direction 18 of transducer portion 10 can be enhanced by exploiting large pre-strain in the perpendicular direction 19. For example, an acrylic elastomeric polymer used as the transducer portion 10 may be stretched by 10 percent in direction 18 and by 500 percent in the perpendicular direction 19. The quantity of pre-strain for a polymer may be based on the polymer material and the desired performance of the polymer in an application. Pre-strain suitable for use with the present invention is further described in commonly owned, co-pending U.S. patent application Ser. No. 09/619,848, which is incorporated by reference for all purposes.

Generally, after the polymer is pre-strained, it may be fixed to one or more objects or mechanisms. For a rigid object, the object is preferably suitably stiff to maintain the level of pre-strain desired in the polymer. A spring or other suitable mechanism that provides a force to strain the polymer may add to any prestrain previously established in the polymer before attachment to the spring or mechanisms, or may be responsible for all the prestrain in the polymer. The polymer may be fixed to the one or more objects or mechanisms according to any conventional method known in the art such as a chemical adhesive, an adhesive layer or material, mechanical attachment, etc.

Transducers and pre-strained polymers of the present invention are not limited to any particular rolled geometry or type of deflection. For example, the polymer and electrodes may be formed into any geometry or shape including tubes and multi-layer rolls, rolled polymers attached between multiple rigid structures, rolled polymers attached across a frame of any geometry—including curved or complex geometries, across a frame having one or more joints, etc. Similar structures may be used with polymers in flat sheets. Deflection of a transducer according to the present invention includes linear expansion and compression in one or more directions, bending, axial deflection when the polymer is rolled, deflection out of a hole provided on an outer cylindrical around the polymer, etc. Deflection of a transducer may be affected by how the polymer is constrained by a frame or rigid structures attached to the polymer.

Materials suitable for use as an electroactive polymer with the present invention may include any substantially insulating polymer or rubber (or combination thereof) that deforms in response to an electrostatic force or whose deformation results in a change in electric field. One suitable material is NuSil CF19-2186 as provided by NuSil Technology of Carpenteria, Calif. Other exemplary materials suitable for use as a pre-strained polymer include silicone elastomers, acrylic elastomers such as VHB 4910 acrylic elastomer as produced by 3M Corporation of St. Paul, Minn., polyurethanes, thermoplastic elastomers, copolymers comprising PVDF, pressure-sensitive adhesives, fluoroelastomers, polymers comprising silicone and acrylic moieties, and the like. Polymers comprising silicone and acrylic moieties may include copolymers comprising silicone and acrylic moieties, polymer blends comprising a silicone elastomer and an acrylic elastomer, for example. Combinations of some of these materials may also be used as the electroactive polymer in transducers of this invention.

Materials used as an electroactive polymer may be selected based on one or more material properties such as a high electrical breakdown strength, a low modulus of elasticity—(for large or small deformations), a high dielectric constant, etc. In one embodiment, the polymer is selected such that is has an elastic modulus at most about 100 MPa. In another embodiment, the polymer is selected such that is has a maximum actuation pressure between about 0.05 MPa and about 10 MPa, and preferably between about 0.3 MPa and about 3 MPa. In another embodiment, the polymer is selected such that is has a dielectric constant between about 2 and about 20, and preferably between about 2.5 and about 12. The present invention is not limited to these ranges. Ideally, materials with a higher dielectric constant than the ranges given above would be desirable if the materials had both a high dielectric constant and a high dielectric strength.

An electroactive polymer layer in transducers of the present invention may have a wide range of thicknesses. In one embodiment, polymer thickness may range between about 1 micrometer and 2 millimeters. Polymer thickness may be reduced by stretching the film in one or both planar directions. In many cases, electroactive polymers of the present invention may be fabricated and implemented as thin films. Thicknesses suitable for these thin films may be below 50 micrometers.

As electroactive polymers of the present invention may deflect at high strains, electrodes attached to the polymers should also deflect without compromising mechanical or electrical performance. Generally, electrodes suitable for use with the present invention may be of any shape and material provided that they are able to supply a suitable voltage to, or receive a suitable voltage from, an electroactive polymer. The voltage may be either constant or varying over time. In one embodiment, the electrodes adhere to a surface of the polymer. Electrodes adhering to the polymer are preferably compliant and conform to the changing shape of the polymer. Correspondingly, the present invention may include compliant electrodes that conform to the shape of an electroactive polymer to which they are attached. The electrodes may be only applied to a portion of an electroactive polymer and define an active area according to their geometry. Several examples of electrodes that only cover a portion of an electroactive polymer will be described in further detail below.

Various types of electrodes suitable for use with the present invention are described in commonly owned, co-pending U.S. patent application Ser. No. 09/619,848, which was previously incorporated by reference above. Electrodes described therein and suitable for use with the present invention include structured electrodes comprising metal traces and charge distribution layers, textured electrodes comprising varying out of plane dimensions, conductive greases such as carbon greases or silver greases, colloidal suspensions, high aspect ratio conductive materials such as carbon fibrils and carbon nanotubes, and mixtures of ionically conductive materials.

Materials used for electrodes of the present invention may vary. Suitable materials used in an electrode may include graphite, carbon black, colloidal suspensions, thin metals including silver and gold, silver filled and carbon filled gels and polymers, and ionically or electronically conductive polymers. In a specific embodiment, an electrode suitable for use with the present invention comprises 80 percent carbon grease and 20 percent carbon black in a silicone rubber binder such as Stockwell RTV60-CON as produced by Stockwell Rubber Co. Inc. of Philadelphia, Pa. The carbon grease is of the type such as NyoGel 756G as provided by Nye Lubricant Inc. of Fairhaven, Mass. The conductive grease may also be mixed with an elastomer, such as silicon elastomer RTV 118 as produced by General Electric of Waterford, N.Y., to provide a gel-like conductive grease.

It is understood that certain electrode materials may work well with particular polymers and may not work as well for others. By way of example, carbon fibrils work well with acrylic elastomer polymers while not as well with silicone polymers. For most transducers, desirable properties for the compliant electrode may include one or more of the following: low modulus of elasticity, low mechanical damping, low surface resistivity, uniform resistivity, chemical and environmental stability, chemical compatibility with the electroactive polymer, good adherence to the electroactive polymer, and the ability to form smooth surfaces. In some cases, a transducer of the present invention may implement two different types of electrodes, e.g. a different electrode type for each active area or different electrode types on opposing sides of a polymer.

Suitable actuation voltages for electroactive polymers, or portions thereof, may vary based on the material properties of the electroactive polymer (e.g., dielectric constant) and the dimensions of the polymer (e.g., polymer film thickness). For example, actuation electric fields used to actuate polymer 102 in FIG. 1A may range in magnitude from about 0 V/m to about 440 MV/m. Actuation electric fields in this range may produce a pressure in the range of about 0 Pa to about 10 MPa. In order for the transducer to produce greater forces, the thickness of the polymer layer may be increased. Actuation voltages for a particular polymer may be reduced by increasing the dielectric constant, decreasing the polymer thickness, and decreasing the modulus of elasticity, for example.

Generally, electrodes suitable for use with the present invention may be of any shape and material provided that they are able to supply a suitable voltage to an electroactive polymer. The voltage may be either constant or varying over time. In one embodiment, the electrodes adhere to a surface of the polymer. As electroactive polymers of the present invention may deflect at high strains, electrodes attached to the polymers should also deflect without compromising mechanical or electrical performance. Correspondingly, the present invention may include compliant electrodes that conform to the changing shape of an electroactive polymer to which they are attached. The electrodes may be only applied to a portion of an electroactive polymer and define an active area according to their geometry. In many cases, such as the pupil described below with respect to FIG. 3C, the shape of the electrode provides substantial simulation of a feature in an animated device.

Various types of electrodes suitable for use with the present invention are described in copending U.S. patent application Ser. No. 09/619,848, which was previously incorporated by reference above. Electrodes described therein and suitable for use with the present invention include structured electrodes comprising metal traces and charge distribution layers, textured electrodes comprising varying out of plane dimensions, conductive greases such as carbon greases or silver greases, colloidal suspensions, high aspect ratio conductive materials such as carbon fibrils and carbon nanotubes, and mixtures of ionically conductive materials.

Materials used for electrodes of the present invention may vary. Suitable materials used in an electrode may include graphite, carbon black, colloidal suspensions, thin metals including silver and gold, silver filled and carbon filled gels and polymers, and ionically or electrically conductive polymers. In a specific embodiment, an electrode suitable for use with the present invention comprises 80 percent carbon grease and 20 percent carbon black in a silicone rubber binder such as Stockwell RTV60-CON as produced by Stockwell Rubber Co. Inc. of Philadelphia, Pa. The carbon grease is of the type such as NyoGel 756G as provided by Nye Lubricant Inc. of Fairhaven, Mass. The conductive grease may also be mixed with an elastomer, such as silicon elastomer RTV 118 as produced by General Electric of Waterford, N.Y., to provide a gel-like conductive grease.

It is understood that certain electrode materials may work well with particular polymers and may not work as well for others. For example, carbon fibrils work well with acrylic elastomer polymers while not as well with silicone polymers. For most transducers, desirable properties for the compliant electrode may include one or more of the following: low modulus of elasticity, low mechanical damping, low surface resistivity, uniform resistivity, chemical and environmental stability, chemical compatibility with the electroactive polymer, good adherence to the electroactive polymer, and the ability to form smooth surfaces. In some cases, a transducer of the present invention may implement two different types of electrodes, e.g. a different electrode type for each active area or different electrode types on opposing sides of a polymer.

Devices of the present invention may also rely on conditioning electronics that provide or receive electrical energy from electrodes of an active area for one of the electroactive polymer functions mentioned above. Conditioning electronics in electrical communication with one or more active areas may include functions such as stiffness control, energy dissipation, electrical energy generation, polymer actuation, polymer deflection sensing, control logic, etc.

For actuation, electronic drivers may be connected to the electrodes. The voltage provided to electrodes of an active area will depend upon specifics of an application. In one embodiment, an active area of the present invention is driven electrically by modulating an applied voltage about a DC bias voltage. Modulation about a bias voltage allows for improved sensitivity and linearity of the transducer to the applied voltage. For example, a transducer used in an audio application may be driven by a signal of up to 200 to 100 volts peak to peak on top of a bias voltage ranging from about 750 to 2000 volts DC.

Suitable actuation voltages for electroactive polymers, or portions thereof, may vary based on the material properties of the electroactive polymer, such as the dielectric constant, as well as the dimensions of the polymer, such as the thickness of the polymer film. For example, actuation electric fields used to actuate polymer 12 in FIG. 4A may range in magnitude from about 0 V/m to about 440 MV/m. Actuation electric fields in this range may produce a pressure in the range of about 0 Pa to about 10 MPa. In order for the transducer to produce greater forces, the thickness of the polymer layer may be increased. Actuation voltages for a particular polymer may be reduced by increasing the dielectric constant, decreasing the polymer thickness, and decreasing the modulus of elasticity, for example.

Transducers of the present invention are also capable of acoustic emission. More specifically, transducers of the present invention may be actuated at frequencies to produce sound in a medium such as air. Thus, the same transducer responsible for actuation of a feature in an animated device may also be responsible for acoustic emission for the animated device. Typically, an audio signal is provided to electrodes in contact with the polymer such that sound waves are produced during rapid actuation and elastic contraction of the transducer. The signal may be a signal from a stereo player or microphone that has been amplified and converted to the correct voltage range. For example, a transducer used to provide acoustic emission may be driven by a signal of up to 200 to 1000 volts peak to peak on top of a bias voltage ranging from about 750 to 2000 volts DC. However, it will be appreciated that the particular voltages used may vary based on the parameters of an application. Further description of electroactive polymer transducers used to produce sound is described in commonly owned, co-pending U.S. patent application entitled "Elastomeric Dielectric Polymer Film Sonic Actuator" naming R. E. Pelrine et al. as inventors, filed on Jul. 19, 1999 (U.S. application Ser. No. 09/356,801), which is incorporated herein for all purposes.

Although the discussion so far has focused primarily on one type of electroactive polymer commonly referred to as dielectric elastomers (transducer 10 of FIG. 1A), animated devices of the present invention may also incorporate other conventional electroactive polymers. As the term is used herein, an electroactive polymer refers to a polymer that responds to electrical stimulation. Other common classes of electroactive polymer suitable for use with many embodiments of the present invention include electrostrictive polymers, electronic electroactive polymers, and ionic electroactive polymers, and some copolymers. Electrostrictive polymers are characterized by the non-linear reaction of a electroactive polymers (relating strain to E2). Electronic electroactive polymers typically change shape or dimensions due to migration of electrons in response to electric field (usually dry). Ionic electroactive polymers are polymers that change shape or dimensions due to migration of ions in response to electric field (usually wet and contains electrolyte). Irradiated copolymer of polyvinylidene difluoride and trifluoroethelene P(VDF-TrFE) is an electroactive polymer suitable for use with some embodiments of the present invention.

Multiple Active Areas

In accordance with the present invention, the term "monolithic" is used herein to refer to electroactive polymers, transducers, and devices comprising a plurality of active areas on a single electroactive polymer.

Figure 1C:
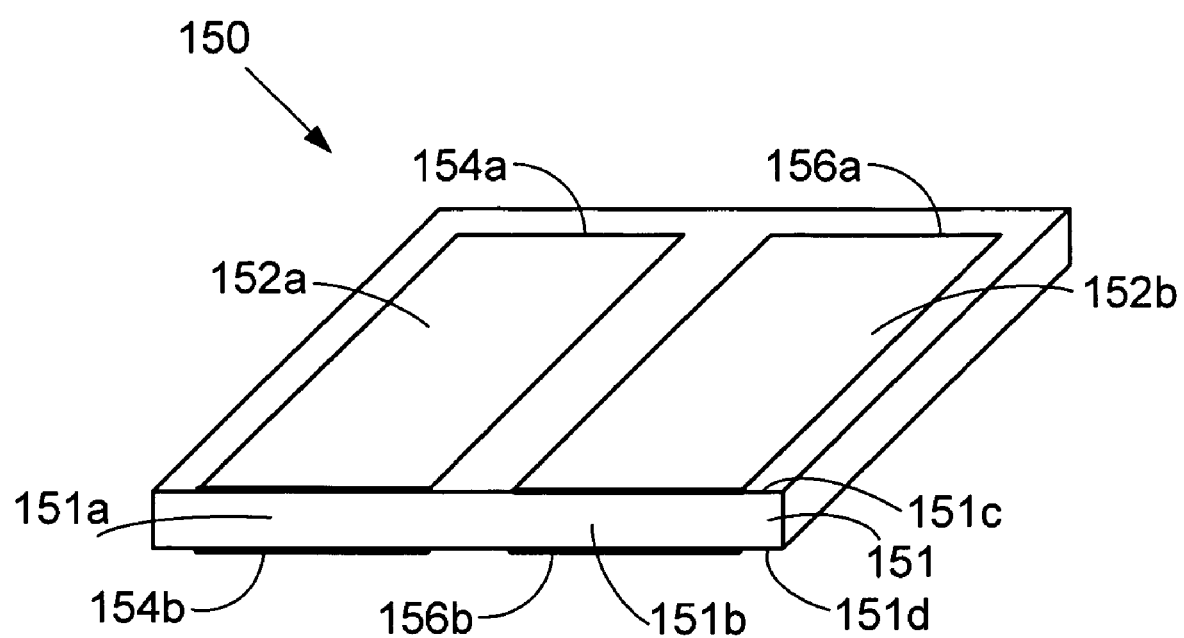
FIG. 1C illustrates a cross-sectional side view of a diaphragm transducer including an electroactive polymer before application of a voltage in accordance with one embodiment of the present invention.

FIG. 1C illustrates a monolithic transducer 150 comprising a plurality of active areas in accordance with one embodiment of the present invention. The monolithic transducer 150 converts between electrical energy and mechanical energy. The monolithic transducer 150 comprises an electroactive polymer 151 including two active areas 152*a* and 152*b*. The polymer 151 can be held using, for example, a rigid frame (not shown) attached at the edges of the polymer 151.

The active area 152*a* has top and bottom electrodes 154*a* and 154*b* attached to the polymer 151 on its top and bottom surfaces 151*c* and 151*d*, respectively. The electrodes 154*a* and 154*b* provide a voltage difference across a portion 151*a* of the polymer 151. The portion 151*a* deflects with a change in electric field provided by the electrodes 154*a* and 154*b*. The portion 151*a* comprises the polymer 151 between the electrodes 154*a* and 154*b* and any other portions of the polymer 151 having sufficient electrostatic force to enable deflection upon application of voltages using the electrodes 154*a* and 154*b*.

The active area 152*b* has top and bottom electrodes 156*a* and 156*b* attached to the polymer 151 on its top and bottom surfaces 151*c* and 151*d*, respectively. The electrodes 156*a* and 156*b* provide a voltage difference across a portion 151*b* of the polymer 151. The portion 151*b* deflects with a change in electric field provided by the electrodes 156*a* and 156*b*. The portion 151*b* comprises the polymer 151 between the electrodes 156*a* and 156*b* and any other portions of the polymer 151 having sufficient stress induced by the electrostatic force to enable deflection upon application of voltages using the electrodes 156*a* and 156*b*.

Active areas for monolithic polymers and transducers of the present invention may be flexibly arranged. In one embodiment, active areas in a polymer are arranged such that elasticity of the active areas is balanced. In another embodiment, a transducer of the present invention includes a plurality of symmetrically arranged active areas. Further description of monolithic transducers suitable for use with the present invention are further described in commonly owned U.S. patent application Ser. No. 09/779,203, which is incorporated by reference herein for all purposes.

Actuator Designs

The deflection of an electroactive polymer can be used in a variety of ways to produce mechanical energy. One common implementation of a transducer in an animated device is within an actuator. Generally speaking, animated devices of the present invention may be implemented with a variety of actuators—including conventional actuators retrofitted with a polymer and custom actuators specially designed for one or more polymers. Conventional actuators include extenders, bending beams, stacks, diaphragms, etc. Several different exemplary actuators suitable for use with some animated devices of the present invention will now be discussed.

A straightforward electroactive polymer drive is one where the transducer acts as a linear actuator in much the same way as a conventional pneumatic or hydraulic cylinder might be employed. FIGS. 2A–2E illustrate several linear electroactive polymer actuators suitable for use with the present invention.

The shape and constraint of an electroactive polymer may affect deflection. An aspect ratio for an electroactive polymer is defined as the ratio of its length to width. If the aspect ratio is high (e.g., an aspect ratio of at least about 4:1) and the polymer is constrained along its length by rigid members, than the combination may result in a substantially one-dimensional deflection in the width direction.

Figure 2A:
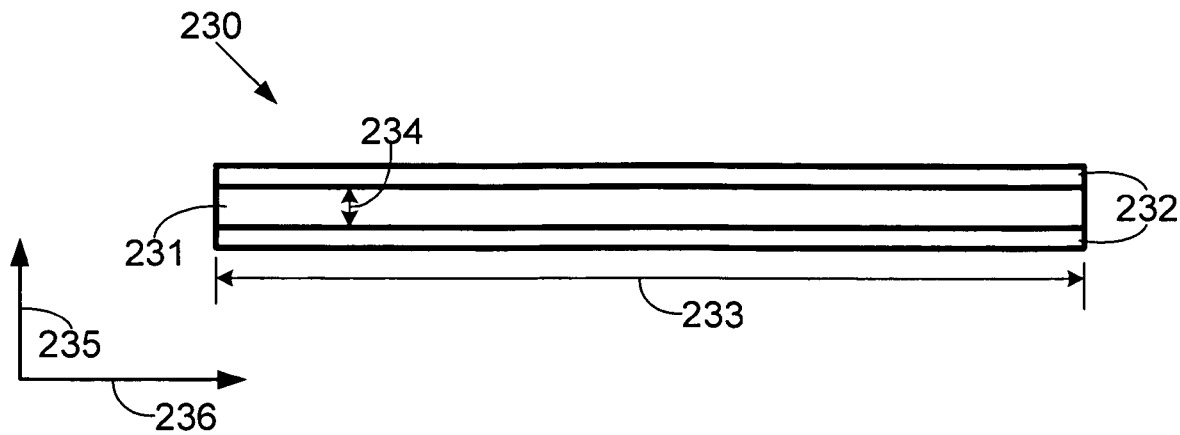
FIGS. 2A and 2B illustrate a linear motion actuator suitable for use with some animated devices of the present invention.
Figure 2B:
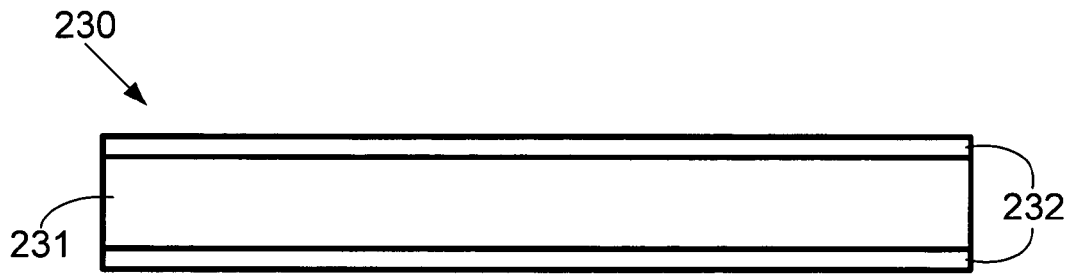

FIGS. 2A and 2B illustrate a linear motion actuator 230 suitable for use with devices of the present invention. The linear motion actuator 230 is a planar mechanism having mechanical deflection in one direction. The linear motion actuator 230 comprises a polymer 231 having a length 233 substantially greater than its width 234 (e.g., an aspect ratio at least about 4:1). The polymer 231 is attached on opposite sides to stiff members 232 of a frame along its length 233. The stiff members 232 have a greater stiffness than the polymer 231. The geometric edge constraint provided by the stiff members 232 substantially prevents displacement in a direction 236 along the polymer length 233 and facilitates deflection almost exclusively in a direction 235. When the linear motion actuator 230 is implemented with a polymer 231 having anisotropic pre-strain, such as a higher pre-strain in the direction 236 than in the direction 235, then the polymer 231 is stiffer in the direction 236 than in the direction 235 and large deflections in the direction 235 may result.

A collection of electroactive polymers or actuators may be mechanically linked to form a larger actuator with a common output, e.g. force and/or displacement. By using a small electroactive polymer as a base unit in a collection, conversion of electric energy to mechanical energy may be scaled according to an application. By way of example, multiple linear motion actuators 230 may be combined in series in the direction 235 to form an actuator having a cumulative deflection of all the linear motion actuators in the series.

Figure 2C:
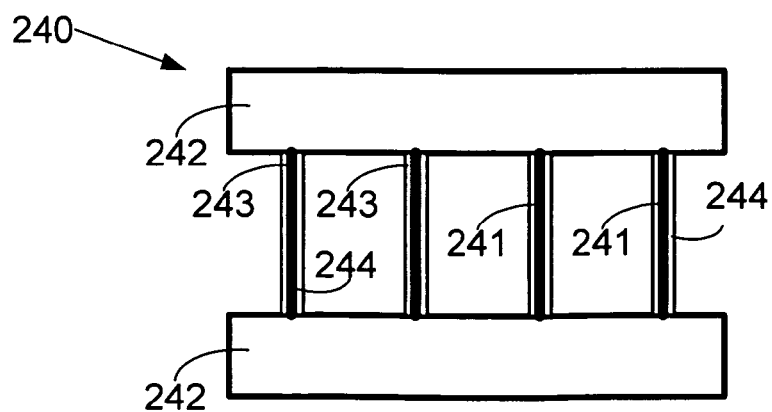
FIG. 2C illustrates cross-sectional side view of a multi-layer actuator suitable for use with some animated devices of the present invention.
Figure 2D:
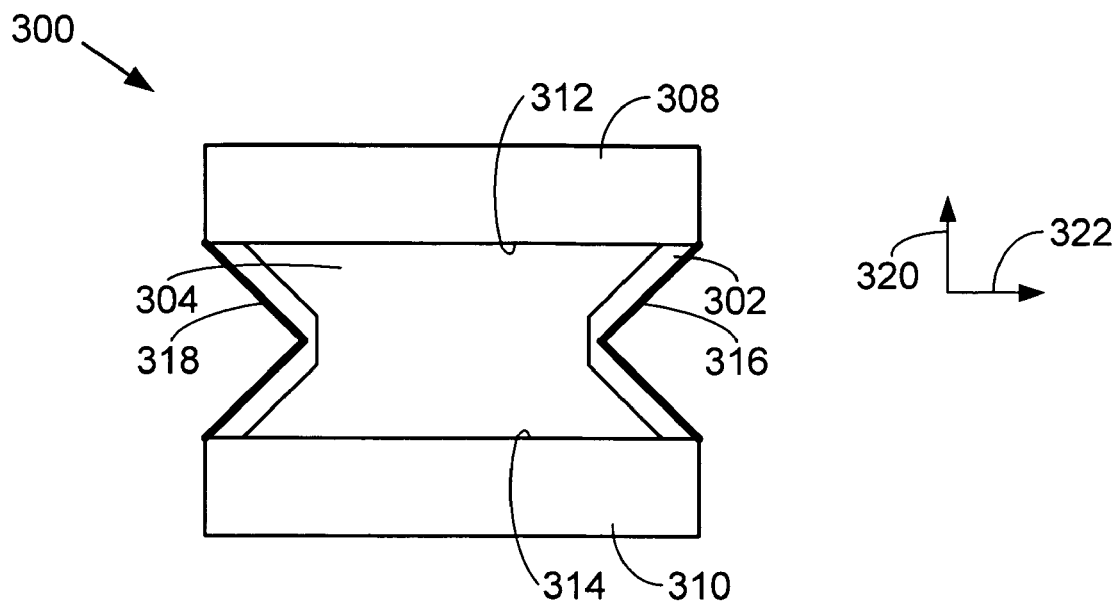
FIGS. 2D and 2E illustrate an actuator suitable for use some animated devices of the present invention.
Figure 2E:
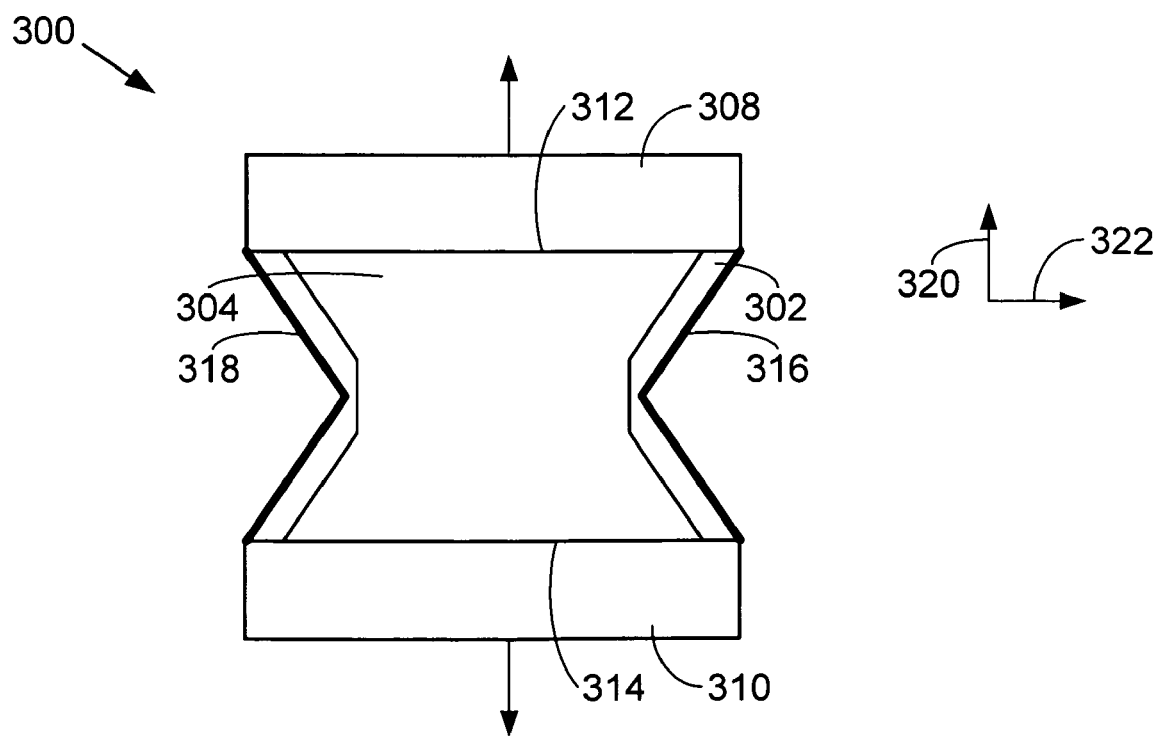

FIG. 2C illustrates cross-sectional side view of a multilayer actuator 240 for converting from electrical energy to mechanical energy. The multilayer actuator 240 includes four pre-strained polymers 241 arranged in parallel and each attached to a rigid frame 242 such that they have the same deflection. Electrodes 243 and 244 are deposited on opposite surfaces of each polymer 241 and are in electrical communication such that they provide simultaneous electrostatic actuation to the four pre-strained polymers 241. The multilayer actuator 240 provides cumulative force output of the individual polymer layers 241. In one embodiment, electrodes 243 and 244 are arranged to provide separate actuation for each polymer 241. In this manner, one may use on-off voltage control actuation of each polymer 241. This arrangement provides a user relatively simple control of force magnitude for the multilayer actuator 240. the the FIGS. 2D and 2E illustrate a linear actuator 300 suitable for use some animated devices of the present invention. The actuator 300 includes a polymer 302 arranged in a manner which causes a portion of the polymer to deflect in response to a change in electric field. Electrodes 304 are attached to opposite surfaces (only the foremost electrode is shown) of the polymer 302 and cover a substantial portion of the polymer 302. Two stiff members 308 and 310 extend along opposite edges 312 and 314 of the polymer 302. Flexures 316 and 318 are situated along the remaining edges of the polymer 302. The flexures 316 and 318 improve conversion from electrical energy to mechanical energy for the actuator 300.

The flexures 316 and 318 couple polymer 302 deflection in one direction into deflection in another direction. In one embodiment, each of the flexures 316 and 318 rest at an angle about 45 degrees in the plane of the polymer 302. Upon actuation of the polymer 302, expansion of the polymer 302 in the direction 320 causes the stiff members 308 and 310 to move apart, as shown in FIG. 2E. In addition, expansion of the polymer 302 in the direction 322 causes the flexures 316 and 318 to straighten, and further separates the stiff members 308 and 310. In this manner, the actuator 300 couples expansion of the polymer 302 in both planar directions 320 and 322 into mechanical output in the direction 320.

One advantage of the actuator 300 is that the entire structure is planar. In addition to simplifying fabrication, the planar structure of the actuator 300 allows for easy mechanical coupling to produce multilayer designs. By way of example, the stiff members 308 and 310 may be mechanically coupled (e.g., glued or similarly fixed) to their respective counterparts of a second actuator 300 to provide two actuators 300 in parallel in order to increase the force output over single actuator 300. Similarly, the stiff member 308 from one actuator may be attached to the stiff member 310 from a second actuator in order to provide multiple actuators in series that increase the deflection output over a single actuator 300.

In another embodiment, electroactive polymers suitable for use the present invention may be rolled or folded into linear transducers and actuators that deflect axially while converting from electrical energy to mechanical energy. As fabrication of electroactive polymers is often simplest with fewer numbers of layers, rolled actuators provide an efficient manner of squeezing large layers of polymer into a compact shape. Rolled or folded transducers and actuators typically include two or more layers of polymer. Rolled or folded actuators are applicable wherever linear actuators are used, such as legs and fingers, high force grippers, or some of the animated designs described below.

Figure 2F:
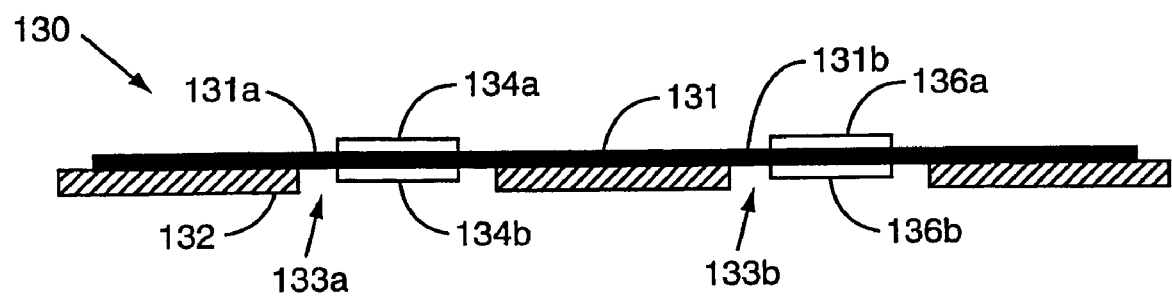
FIG. 2F illustrates a cross-sectional side view of a diaphragm actuator before application of a voltage in accordance with one embodiment of the present invention.
Figure 2G:
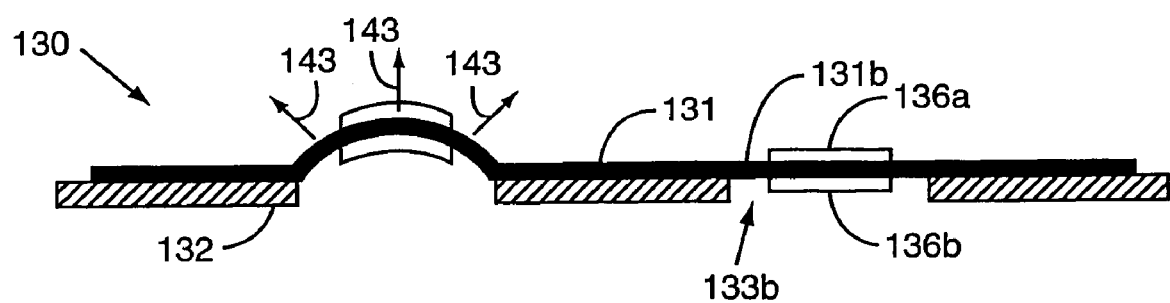
FIG. 2G illustrates a cross-sectional view of the diaphragm actuator of FIG. 2F after application of a voltage in accordance with one embodiment of the present invention.

FIGS. 2F–G illustrate a cross-sectional side view of a monolithic diaphragm actuator 130 comprising a monolithic polymer 131 before deflection in accordance with one embodiment of the present invention. The polymer 131 is attached to a frame 132. The frame 132 includes apertures 133a and 133b that allow deflection of polymer portions 131a and 131b perpendicular to the area of the apertures 133a and 133b, respectively. The diaphragm device 130 comprises electrodes 134a and 134b attached on either side of the portion 131a to provide a voltage difference across the portion 131a. Electrodes 136a and 136b are deposited on either side of the portion 131b to provide a voltage difference across the portion 131b. The electrodes 134 and 136 are compliant and change shape with polymer 131 as it deflects. In the voltage-off configuration of FIG. 2F, polymer 131 is stretched and secured to frame 132 with tension to achieve pre-strain.

Using electrodes 134 and 136, portions 131a and 131b are capable of independent deflection. For example, upon application of a suitable voltage between electrodes 134a and 134b, portion 131a expands away from the plane of the frame 132, as illustrated in FIG. 2G. Each of the portions 131a and 131b is capable of expansion in both perpendicular directions away from the plane. In one embodiment, one side of polymer 131 comprises a bias pressure that influences the expansion of the polymer film 131 to continually actuate upward in the direction of arrows 143 (FIG. 2G). In another embodiment, a swelling agent such as a small amount of silicone oil is applied to the bottom side to influence the expansion of polymer 131 in the direction of arrows 143. The swelling agent allows the diaphragm to continually actuate in a desired direction without using a bias pressure. The swelling agent causes slight permanent deflection in one direction as determined during fabrication, e.g. by supplying a slight pressure to the bottom side when the swelling agent is applied. The swelling agent allows the diaphragm to continually actuate in a desired direction without using a bias pressure.

Figure 2H:
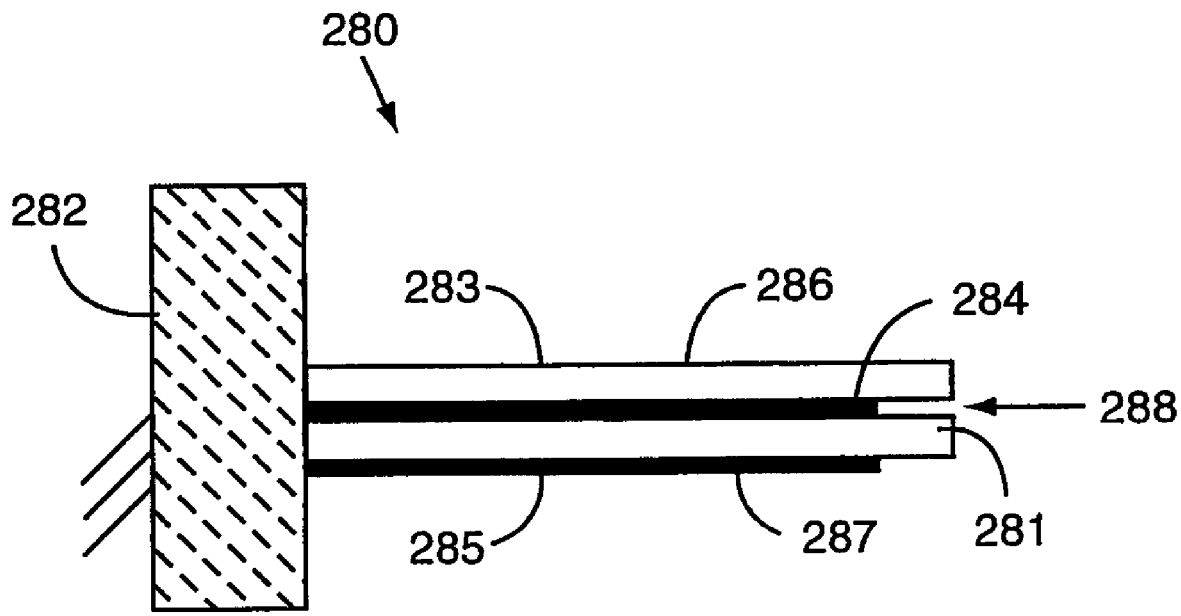
FIGS. 2H and 2I illustrate a bending beam actuator suitable for use with some animated devices of the present invention.
Figure 2I:
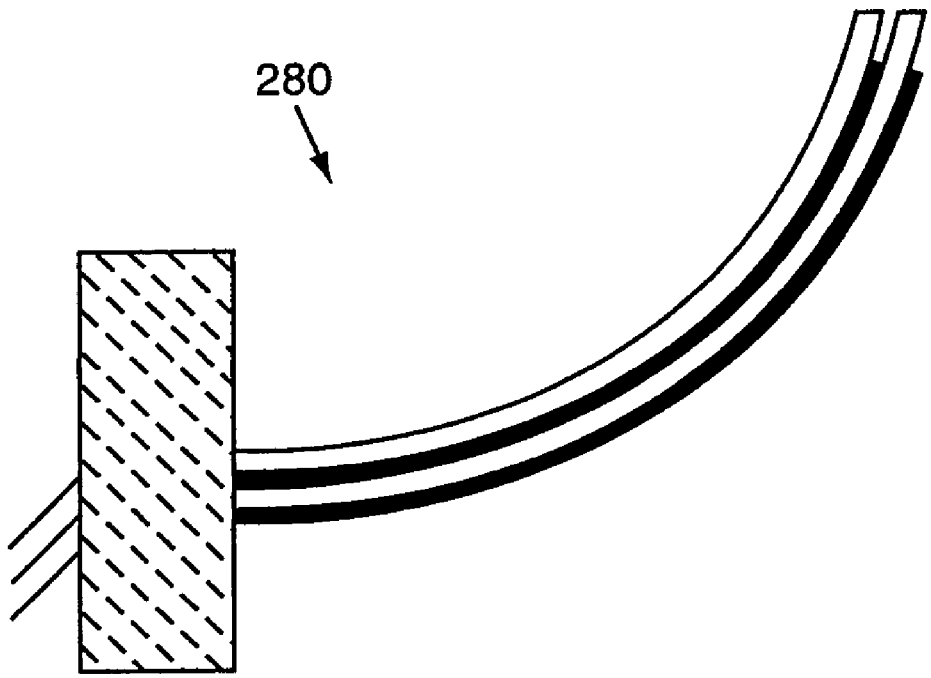

FIG. 2H illustrates a bending beam actuator 280 suitable for use with animated devices of the present invention. The bending beam actuator 280 includes a polymer 281 fixed at one end by member 282 and attached to a flexible thin material 283 such as polyimide or mylar using an adhesive layer, for example. The flexible thin material 283 has a modulus of elasticity greater than the polymer 281. The difference in modulus of elasticity for the top and bottom sides 286 and 287 of the bending beam actuator 280 causes the bending beam actuator 280 to bend upon actuation. Electrodes 284 and 285 are attached to the opposite sides of the polymer 281 to provide electrical energy. The bending beam actuator 280 includes a free end 288 having a single bending degree of freedom. Deflection of the free end 288 may be measured by the difference in angle between the free end 288 and the end fixed by the rigid support 282. FIG. 2I illustrates the bending beam actuator 280 with a 90 degree bending angle. The maximum bending angle for the bending beam actuator 280 will vary with a number of factors including the polymer material, the actuator length, the bending stiffness of the electrodes 284 and 285 and flexible thin material 283, etc.

Although FIGS. 2A–2I illustrate several actuators suitable for use with motors of the present invention, other actuators including one or more electroactive polymers may also be used. Other exemplary actuators include bending beam actuators, diaphragm actuators and inchworm actuators are also suitable for use with the present invention. Additional exemplary linear and non-linear actuators suitable for use with the present invention are described in commonly owned U.S. patent application Ser. No. 09/619,848, which was previously incorporated by reference.

Figure 4A:
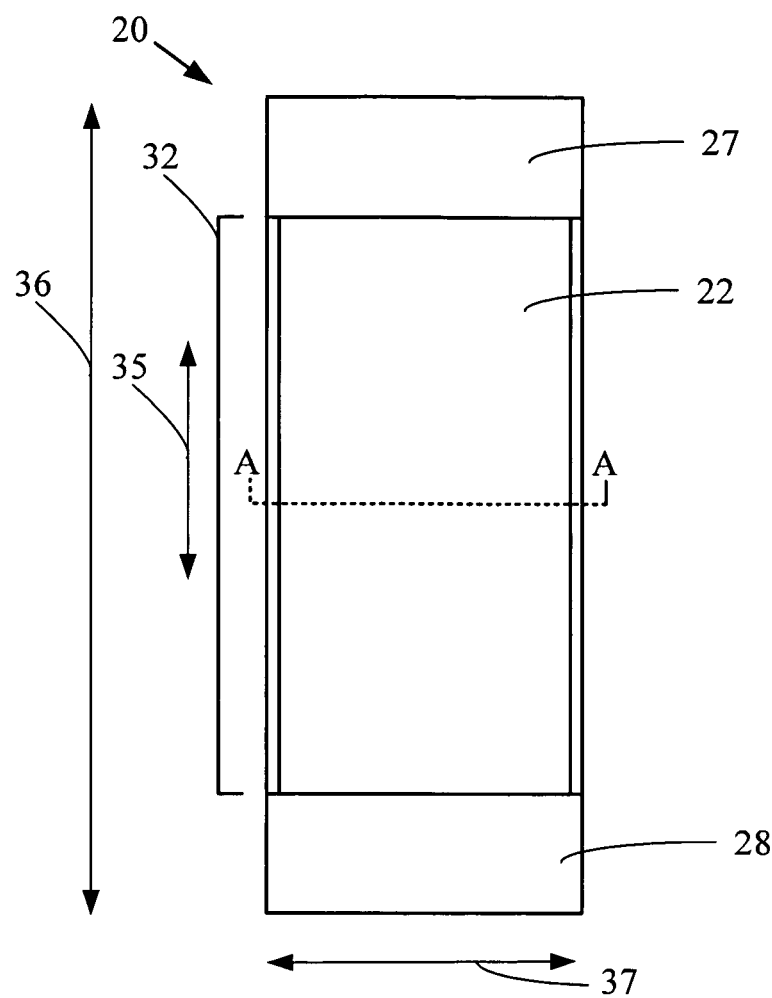
FIGS. 4A–4D illustrate a rolled electroactive polymer device in accordance with one embodiment of the present invention.
Figure 4B:
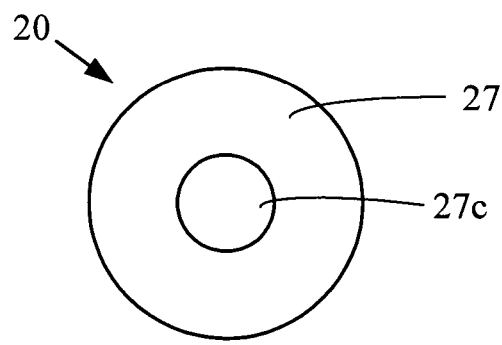
Figure 4C:
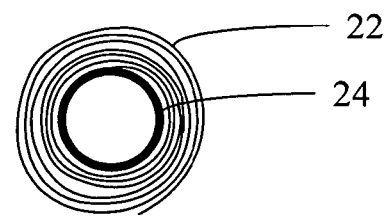
Figure 4D:
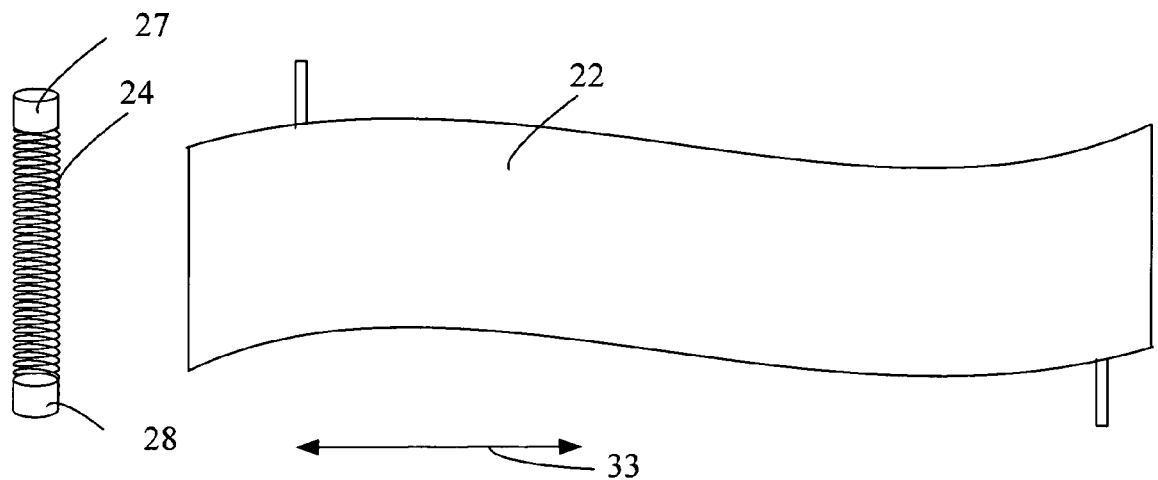

FIGS. 4A–4E show a rolled electroactive polymer device 20 in accordance with one embodiment of the present invention. The rolled electroactive polymer device may be used for actuation in EPAM devices for performing thermodynamic work on a fluid and may also act as part of a fluid conduit or other types of structures immersed in an external or internal flowfield that is used with the devices for performing thermodynamic work. The rolled electroactive polymer devices may provide linear and/or rotational/torsional motion for operating the EPAM devices. For instance, see the fan embodiment in FIG. 2H. FIG. 4A illustrates a side view of device 20. FIG. 4B illustrates an axial view of device 20 from the top end. FIG. 4C illustrates an axial view of device 20 taken through cross section A—A. FIG. 4D illustrates components of device 20 before rolling. Device 20 comprises a rolled electroactive polymer 22, spring 24, end pieces 27 and 28, and various fabrication components used to hold device 20 together.

As illustrated in FIG. 4C, electroactive polymer 22 is rolled. In one embodiment, a rolled electroactive polymer refers to an electroactive polymer with, or without electrodes, wrapped round and round onto itself (e.g., like a poster) or wrapped around another object (e.g., spring 24). The polymer may be wound repeatedly and at the very least comprises an outer layer portion of the polymer overlapping at least an inner layer portion of the polymer. In one embodiment, a rolled electroactive polymer refers to a spirally wound electroactive polymer wrapped around an object or center. As the term is used herein, rolled is independent of how the polymer achieves its rolled configuration.

As illustrated by FIGS. 4C and 4D, electroactive polymer 22 is rolled around the outside of spring 24. Spring 24 provides a force that strains at least a portion of polymer 22. The top end 24a of spring 24 is attached to rigid endpiece 27. Likewise, the bottom end 24b of spring 24 is attached to rigid endpiece 28. The top edge 22a of polymer 22 (FIG. 4D) is wound about endpiece 27 and attached thereto using a suitable adhesive. The bottom edge 22b of polymer 22 is wound about endpiece 28 and attached thereto using an adhesive. Thus, the top end 24a of spring 24 is operably coupled to the top edge 22a of polymer 22 in that deflection of top end 24a corresponds to deflection of the top edge 22a of polymer 22. Likewise, the bottom end 24b of spring 24 is operably coupled to the bottom edge 22b of polymer 22 and deflection bottom end 24b corresponds to deflection of the bottom edge 22b of polymer 22. Polymer 22 and spring 24 are capable of deflection between their respective bottom top portions.

As mentioned above, many electroactive polymers perform better when prestrained. For example, some polymers exhibit a higher breakdown electric field strength, electrically actuated strain, and energy density when prestrained. Spring 24 of device 20 provides forces that result in both circumferential and axial prestrain onto polymer 22.

Spring 24 is a compression spring that provides an outward force in opposing axial directions (FIG. 4A) that axially stretches polymer 22 and strains polymer 22 in an axial direction. Thus, spring 24 holds polymer 22 in tension in axial direction 35. In one embodiment, polymer 22 has an axial prestrain in direction 35 from about 50 to about 300 percent. As will be described in further detail below for fabrication, device 20 may be fabricated by rolling a pre-strained electroactive polymer film around spring 24 while it the spring is compressed. Once released, spring 24 holds the polymer 22 in tensile strain to achieve axial prestrain.

Spring 24 also maintains circumferential prestrain on polymer 22. The prestrain may be established in polymer 22 longitudinally in direction 33 (FIG. 4D) before the polymer is rolled about spring 24. Techniques to establish prestrain in this direction during fabrication will be described in greater detail below. Fixing or securing the polymer after rolling, along with the substantially constant outer dimensions for spring 24, maintains the circumferential prestrain about spring 24. In one embodiment, polymer 22 has a circumferential prestrain from about 100 to about 500 percent. In many cases, spring 24 provides forces that result in anisotropic prestrain on polymer 22.

Figure 4E:
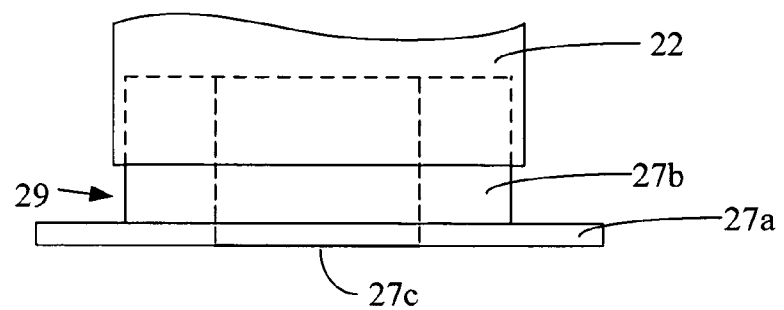
FIG. 4E illustrates an end piece for the rolled electroactive polymer device of FIG. 2A in accordance with one embodiment of the present invention.
Figure 4F:
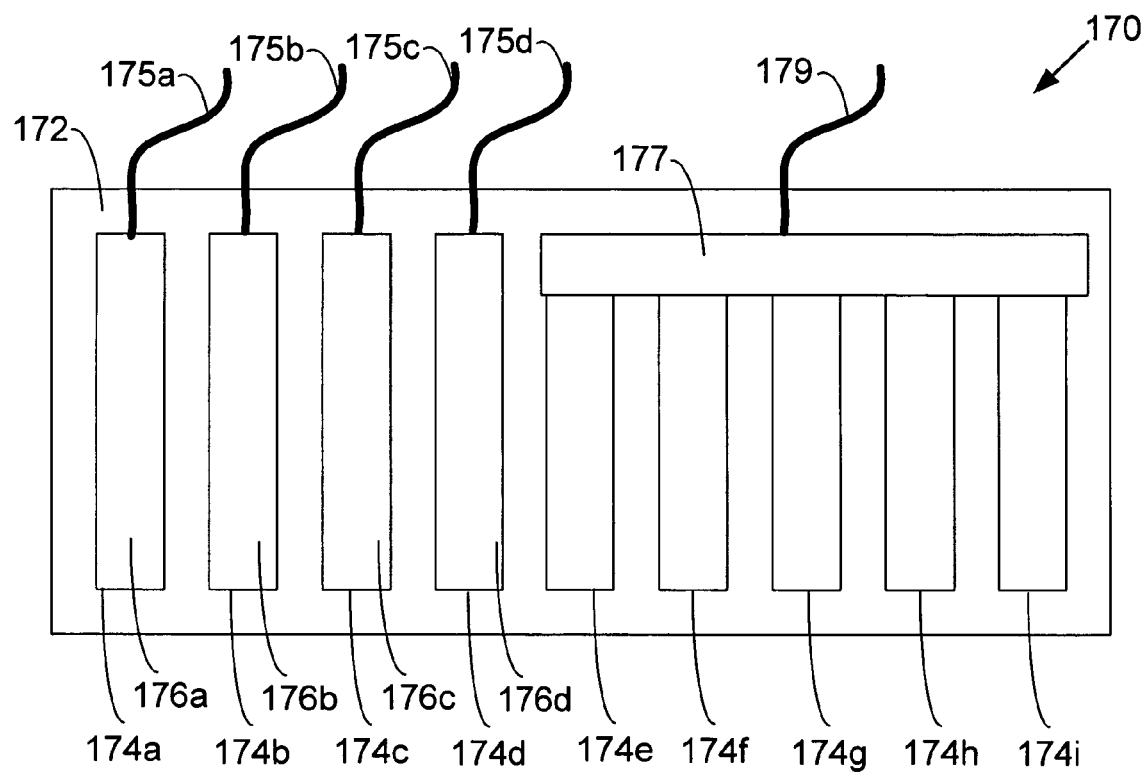
FIG. 4F illustrates a monolithic transducer comprising a plurality of active areas on a single polymer, before rolling, in accordance with one embodiment of the present invention.

End pieces 27 and 28 are attached to opposite ends of rolled electroactive polymer 22 and spring 24. FIG. 4E illustrates a side view of end piece 27 in accordance with one embodiment of the present invention. Endpiece 27 is a circular structure that comprises an outer flange 27a, an interface portion 27b, and an inner hole 27c. Interface portion 27b preferably has the same outer diameter as spring 24. The edges of interface portion 27b may also be rounded to prevent polymer damage. Inner hole 27c is circular and passes through the center of endpiece 27, from the top end to the bottom outer end that includes outer flange 27a. In a specific embodiment, endpiece 27 comprises aluminum, magnesium or another machine metal. Inner hole 27c is defined by a hole machined or similarly fabricated within endpiece 27. In a specific embodiment, endpiece 27 comprises ½ inch end caps with a ⅜ inch inner hole 27c.

In one embodiment, polymer 22 does not extend all the way to outer flange 27a and a gap 29 is left between the outer portion edge of polymer 22 and the inside surface of outer flange 27a. As will be described in further detail below, an adhesive or glue may be added to the rolled electroactive polymer device to maintain its rolled configuration. Gap 29 provides a dedicated space on endpiece 27 for an adhesive or glue than the buildup to the outer diameter of the rolled device and fix to all polymer layers in the roll to endpiece 27. In a specific embodiment, gap 29 is between about 0 mm and about 5 mm.

The portions of electroactive polymer 22 and spring 24 between end pieces 27 and 28 may be considered active to their functional purposes. Thus, end pieces 27 and 28 define an active region 32 of device 20 (FIG. 4A). End pieces 27 and 28 provide a common structure for attachment with spring 24 and with polymer 22. In addition, each end piece 27 and 28 permits external mechanical and detachable coupling to device 20. For example, device 20 may be employed in a robotic application where endpiece 27 is attached to an upstream link in a robot and endpiece 28 is attached to a downstream link in the robot. Actuation of electroactive polymer 22 then moves the downstream link relative to the upstream link as determined by the degree of freedom between the two links (e.g., rotation of link 2 about a pin joint on link 1).

In a specific embodiment, inner hole 27c comprises an internal thread capable of threaded interface with a threaded member, such as a screw or threaded bolt. The internal thread permits detachable mechanical attachment to one end of device 20. For example, a screw may be threaded into the internal thread within end piece 27 for external attachment to a robotic element. For detachable mechanical attachment internal to device 20, a nut or bolt to be threaded into each end piece 27 and 28 and pass through the axial core of spring 24, thereby fixing the two end pieces 27 and 28 to each other. This allows device 20 to be held in any state of deflection, such as a fully compressed state useful during rolling. This may also be useful during storage of device 20 so that polymer 22 is not strained in storage.

In one embodiment, a stiff member or linear guide 30 is disposed within the spring core of spring 24. Since the polymer 22 in spring 24 is substantially compliant between end pieces 27 and 28, device 20 allows for both axial deflection along direction 35 and bending of polymer 22 and spring 24 away from its linear axis (the axis passing through the center of spring 24). In some embodiments, only axial deflection is desired. Linear guide 30 prevents bending of device 20 between end pieces 27 and 28 about the linear axis. Preferably, linear guide 30 does not interfere with the axial deflection of device 20. For example, linear guide 30 preferably does not introduce frictional resistance between itself and any portion of spring 24. With linear guide 30, or any other suitable constraint that prevents motion outside of axial direction 35, device 20 may act as a linear actuator or generator with output strictly in direction 35. Linear guide 30 may be comprised of any suitably stiff material such as wood, plastic, metal, etc.

Polymer 22 is wound repeatedly about spring 22. For single electroactive polymer layer construction, a rolled electroactive polymer of the present invention may comprise between about 2 and about 200 layers. In this case, a layer refers to the number of polymer films or sheets encountered in a radial cross-section of a rolled polymer. In some cases, a rolled polymer comprises between about 5 and about 100 layers. In a specific embodiment, a rolled electroactive polymer comprises between about 15 and about 50 layers.

In another embodiment, a rolled electroactive polymer employs a multilayer structure. The multilayer structure comprises multiple polymer layers disposed on each other before rolling or winding. For example, a second electroactive polymer layer, without electrodes patterned thereon, may be disposed on an electroactive polymer having electrodes patterned on both sides. The electrode immediately between the two polymers services both polymer surfaces in immediate contact. After rolling, the electrode on the bottom side of the electroded polymer then contacts the top side of the non-electroded polymer. In this manner, the second electroactive polymer with no electrodes patterned thereon uses the two electrodes on the first electroded polymer.

Other multilayer constructions are possible. For example, a multilayer construction may comprise any even number of polymer layers in which the odd number polymer layers are electroded and the even number polymer layers are not. The upper surface of the top non-electroded polymer then relies on the electrode on the bottom of the stack after rolling. Multilayer constructions having 2, 4, 6, 8, etc., are possible this technique. In some cases, the number of layers used in a multilayer construction may be limited by the dimensions of the roll and thickness of polymer layers. As the roll radius decreases, the number of permissible layers typically decrease is well. Regardless of the number of layers used, the rolled transducer is configured such that a given polarity electrode does not touch an electrode of opposite polarity. In one embodiment, multiple layers are each individually electroded and every other polymer layer is flipped before rolling such that electrodes in contact each other after rolling are of a similar voltage or polarity.

The multilayer polymer stack may also comprise more than one type of polymer For example, one or more layers of a second polymer may be used to modify the elasticity or stiffness of the rolled electroactive polymer layers. This polymer may or may not be active in the charging/discharging during the actuation. When a non-active polymer layer is employed, the number of polymer layers may be odd. The second polymer may also be another type of electroactive polymer that varies the performance of the rolled product.

In one embodiment, the outermost layer of a rolled electroactive polymer does not comprise an electrode disposed thereon. This may be done to provide a layer of mechanical protection, or to electrically isolate electrodes on the next inner layer. For example, inner and outer layers and surface coating may be selected to provide fluid compatibility as previously described. The multiple layer characteristics described above may also be applied non-rolled electroactive polymers, such as EPAM diaphragms previously described.

Device 20 provides a compact electroactive polymer device structure and improves overall electroactive polymer device performance over conventional electroactive polymer devices. For example, the multilayer structure of device 20 modulates the overall spring constant of the device relative to each of the individual polymer layers. In addition, the increased stiffness of the device achieved via spring 24 increases the stiffness of device 20 and allows for faster response in actuation, if desired.

In a specific embodiment, spring 24 is a compression spring such as catalog number 11422 as provided by Century Spring of Los Angeles, Calif. This spring is characterized by a spring force of 0.91 lb/inch and dimensions of 4.38 inch free length, 1.17 inch solid length, 0.360 inch outside diameter, 0.3 inch inside diameter. In this case, rolled electroactive polymer device 20 has a height 36 from about 5 to about 7 cm, a diameter 37 of about 0.8 to about 1.2 cm, and an active region between end pieces of about 4 to about 5 cm. The polymer is characterized by a circumferential prestrain from about 300 to about 500 percent and axial prestrain (including force contributions by spring 24) from about 150 to about 250 percent.

Although device 20 is illustrated with a single spring 24 disposed internal to the rolled polymer, it is understood that additional structures such as another spring external to the polymer may also be used to provide strain and prestrain forces. These external structures may be attached to device 20 using end pieces 27 and 28 for example.

In another embodiment, multiple active areas on an electroactive polymer are disposed such subsets of the active areas radially align after rolling. For example, the multiple the active areas may be disposed such that, after rolling, active areas are disposed every 90 degrees in the roll. These radially aligned electrodes may then be actuated in unity to allow multiple degree of freedom motion for a rolled electroactive polymer device. Thus, the rolled polymer devices are one embodiment of multi degrees of freedom that may be obtained with transducer configuration of the present invention.

Figures 4G, 4H:
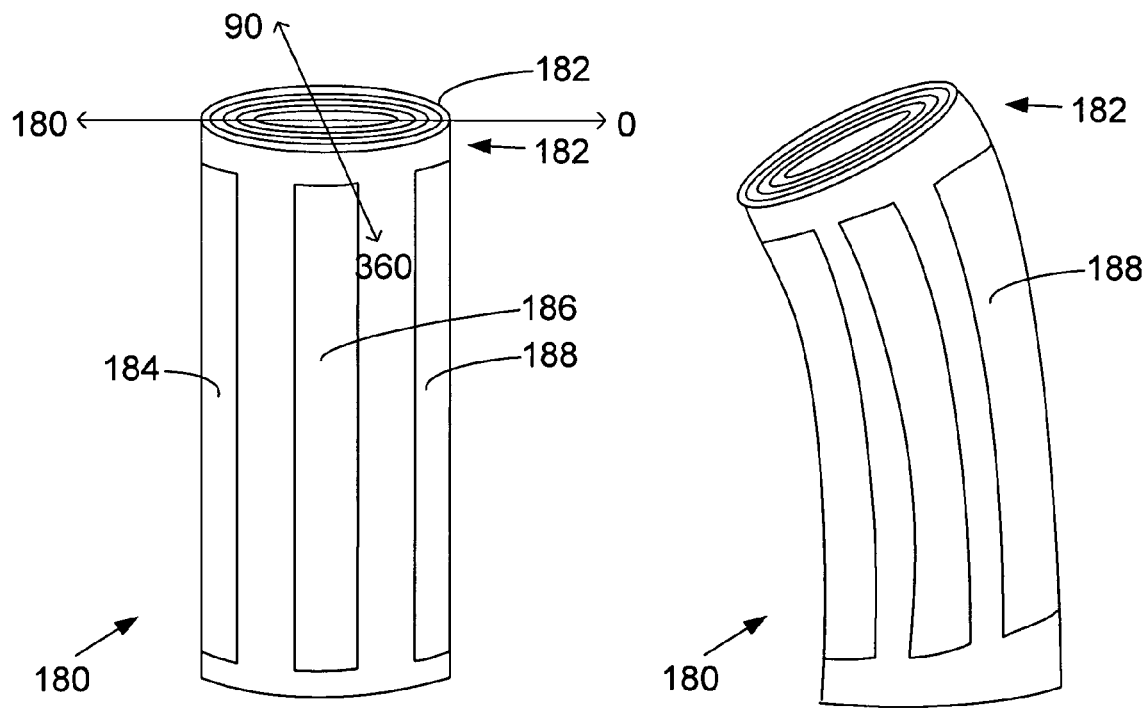
FIG. 4G illustrates a rolled transducer that produces two-dimensional output in accordance with one environment of the present invention.
FIG. 4H illustrates the rolled transducer of FIG. 4G with actuation for one set of radially aligned active areas.

FIG. 4G illustrates a rolled transducer 180 capable of two-dimensional output in accordance with one environment of the present invention. Transducer 180 comprises an electroactive polymer 182 rolled to provide ten layers. Each layer comprises four radially aligned active areas. The center of each active area is disposed at a 90 degree increment relative to its neighbor. FIG. 4G shows the outermost layer of polymer 182 and radially aligned active areas 184, 186, and 188, which are disposed such that their centers mark 90 degree increments relative to each other. A fourth radially aligned active area (not shown) on the backside of polymer 182 has a center approximately situated 180 degrees from radially aligned active area 186.

Radially aligned active area 184 may include common electrical communication with active areas on inner polymer layers having the same radial alignment. Likewise, the other three radially aligned outer active areas 182, 186, and the back active area not shown, may include common electrical communication with their inner layer counterparts. In one embodiment, transducer 180 comprises four leads that provide common actuation for each of the four radially aligned active area sets.

FIG. 4H illustrates transducer 180 with radially aligned active area 188, and its corresponding radially aligned inner layer active areas, actuated. Actuation of active area 188, and corresponding inner layer active areas, results in axial expansion of transducer 188 on the opposite side of polymer 182. The result is lateral bending of transducer 180, approximately 180 degrees from the center point of active area 188. The effect may also be measured by the deflection of a top portion 189 of transducer 180, which traces a radial arc from the resting position shown in FIG. 4G to his position at shown in FIG. 4H. Varying the amount of electrical energy provided to active area 188, and corresponding inner layer active areas, controls the deflection of the top portion 189 along this arc. Thus, top portion 189 of transducer 180 may have a deflection as shown in FIG. 4G, or greater, or a deflection minimally away from the position shown in FIG. 4G. Similar bending in an another direction may be achieved by actuating any one of the other radially aligned active area sets.

Combining actuation of the radially aligned active area sets produces a two-dimensional space for deflection of top portion 189. For example, radially aligned active area sets 186 and 184 may be actuated simultaneously to produce deflection for the top portion in a 45 degree angle corresponding to the coordinate system shown in FIG. 4G. Decreasing the amount of electrical energy provided to radially aligned active area set 186 and increasing the amount of electrical energy provided to radially aligned active area set 184 moves top portion 189 closer to the zero degree mark. Suitable electrical control then allows top portion 189 to trace a path for any angle from 0 to 360 degrees, or follow variable paths in this two dimensional space.

Transducer 180 is also capable of three-dimensional deflection. Simultaneous actuation of active areas on all four sides of transducer 180 will move top portion 189 upward. In other words, transducer 180 is also a linear actuator capable of axial deflection based on simultaneous actuation of active areas on all sides of transducer 180. Coupling this linear actuation with the differential actuation of radially aligned active areas and their resulting two-dimensional deflection as just described above, results in a three dimensional deflection space for the top portion of transducer 180. Thus, suitable electrical control allows top portion 189 to move both up and down as well as trace two-dimensional paths along this linear axis.

Although transducer 180 is shown for simplicity with four radially aligned active area sets disposed at 90 degree increments, it is understood that transducers of the present invention capable of two- and three-dimensional motion may comprise more complex or alternate designs. For example, eight radially aligned active area sets disposed at 45 degree increments. Alternatively, three radially aligned active area sets disposed at 120 degree increments may be suitable for 2D and 3-D motion.

In addition, although transducer 180 is shown with only one set of axial active areas, the structure of FIG. 4G is modular. In other words, the four radially aligned active area sets disposed at 90 degree increments may occur multiple times in an axial direction. For example, radially aligned active area sets that allow two- and three-dimensional motion may be repeated ten times to provide a wave pattern that may be impressed on a fluid flow.

Animated Devices

Exemplary Animated Devices

Figure 3A:
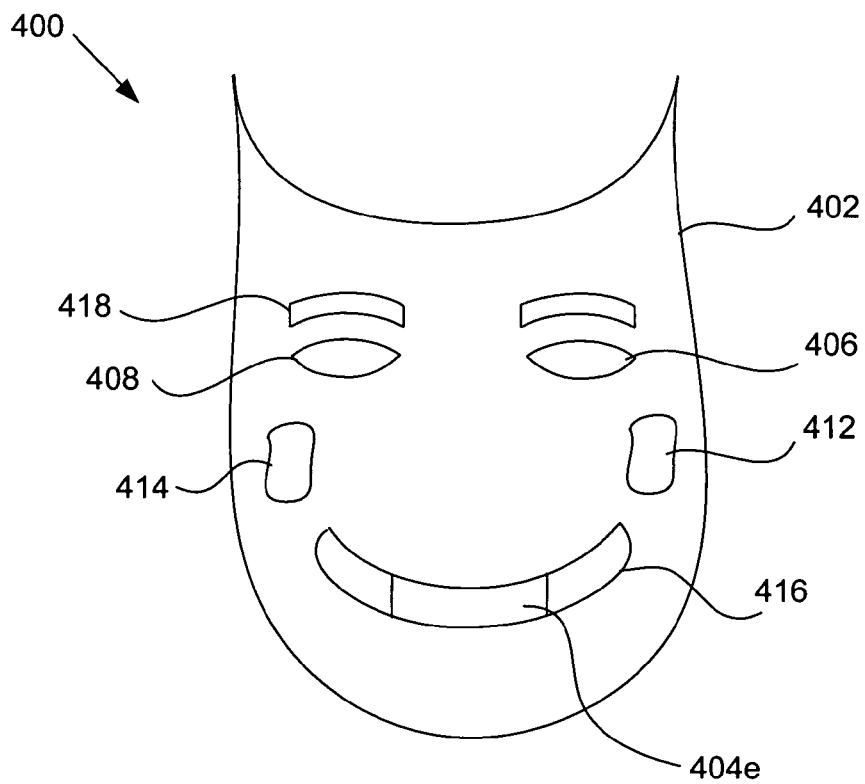
FIGS. 3A–B illustrate an animatronic face in accordance with one embodiment of the present invention.
Figure 3B:
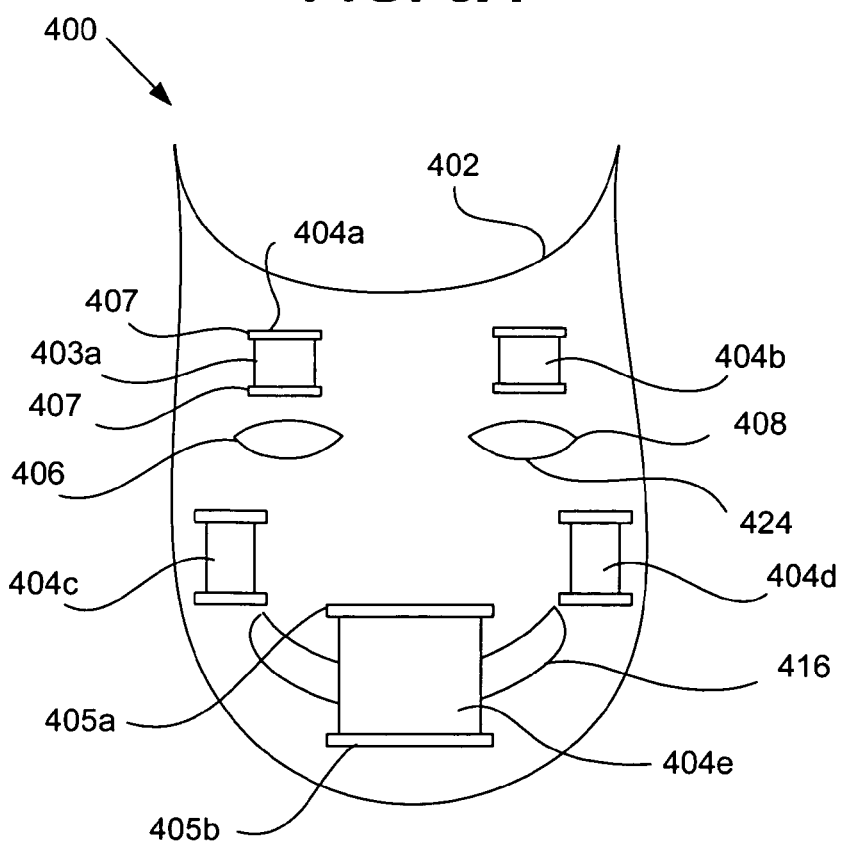

Electroactive polymer transducers are well-suited for use in animatronic devices such as animatronic faces. FIGS. 3A–B illustrate front and back perspective views, respectively, of an animatronic face 400 in accordance with one embodiment of the present invention. The face 400 is made from a polymer mold 402 of silicone rubber and is fabricated according to conventional silicone rubber molding techniques. Attached on the inside of the mold 402 are a series of actuators 404a–e. Each of the actuators 404a–e comprise a transducer having an electroactive polymer 403 and electrodes attached on opposing surfaces of the electroactive polymer 403. The polymer mold 402 is flexible and changes shape with deflection of the actuators 404a–e. The flexibility of the polymer may be controlled so that the motion occurs primarily in certain regions of interest. This control may be accomplished by molding the polymer thinner in certain areas. A relatively rigid frame with hinged joints may also be incorporated beneath the polymer to ensure that motion only occurs between specific regions of the polymer.

Each actuator 404 is responsible for providing motion of a separate feature of face 400. In one embodiment, each actuator 404 is a linear actuator similar to the linear actuator of FIGS. 2D and 2E and has opposing rigid members 407 attached to mold 402. The rigid members 407 translate deflection of each electroactive polymer transducer into motion of a feature for the face 400. For example, actuator 404e has upper and lower rigid members 405a and 405b that are attached above and below a mouth 416.

Referring to the outer appearance of the face 400 (FIG. 3A), actuation and deflection of actuator 404a vertically opens right eye 406. When electrical energy is removed from actuator 404a, elastic return of electroactive polymer 403a included in actuator 404a, and elastic return of the mold 402, return right eye 406 to its resting position. Similarly, deflection of actuator 404b vertically opens a left eye 408. When electrical energy is removed from actuator 404b, elastic return of mold 402 and electroactive polymer 403b return left eye 408 to its resting position. Deflection and elastic return of actuators 404c and 404d provide motion for right and left cheeks 412 and 414, respectively. Deflection and elastic return of actuator 404e provides motion for mouth 416.

Actuators 404a–e are capable of independent actuation and may be individually or collectively used to simulate motion of a human face. For example, independent actuation of actuator 404e may be used to simulate mouth 416 movements corresponding to speech for the face 400. As electroactive polymers are capable of independent and complex time varying deflections, controlled actuation of multiple actuators 404a–e may be used to simulate complicated motions such as those that simulate human emotion. In a specific embodiment, independent actuation of actuators 404a–d are used to provide facial expressions that correspond emotionally to speech provided by mouth 416. For example, actuators 404a and 404b may both be actuated to open both eyes 406 and 408, thereby simulating surprise for face 400. The degree of surprise may be varied by differing the speed and displacement magnitude of actuation of actuators 404a and 404b. Eyebrows 418 may also accentuate the effect of displacement and human-like simulation provided by actuators 404a and 404b. Alternatively, actuators 404c and 404d may be simultaneously actuated to simulate a human smile. The type of smile, or degree of emotion conveyed by the smile, may be varied by differential actuation of the actuators 404c and 404d. As one skilled in animatronics will appreciate, controlled actuation of actuators 404a–e may be performed in a variety of ways to convey emotion and facial expressions for face 400.

Actuator 404e is configured such that the polymer included therein is capable of producing sound. In this case, the same transducer may be used for both actuation of mouth 416 and acoustic emission. When actuation and acoustic emission is performed simultaneously, the audio signal is superimposed on an actuation signal. The actuation is distinguished from the acoustic emission signal largely by frequency. The acoustic signal is typically of much higher frequency and lower magnitude than the lower frequency actuation signal. This high-frequency signal will have little effect on the resultant motion. In many cases, a DC bias is included with the high-frequency acoustic signal. This DC bias will produce a small amount of actuator motion which is usually acceptable. Often the acoustic emission is done at the same time as the actuation. In this case, the bias may be part of the actuation signal (linearly superimposed). The magnitude of the acoustic signal may be scaled such that the magnitude of the acoustic response is of the desired frequency profile, regardless of the magnitude of the actuation signal.

Figure 3C:
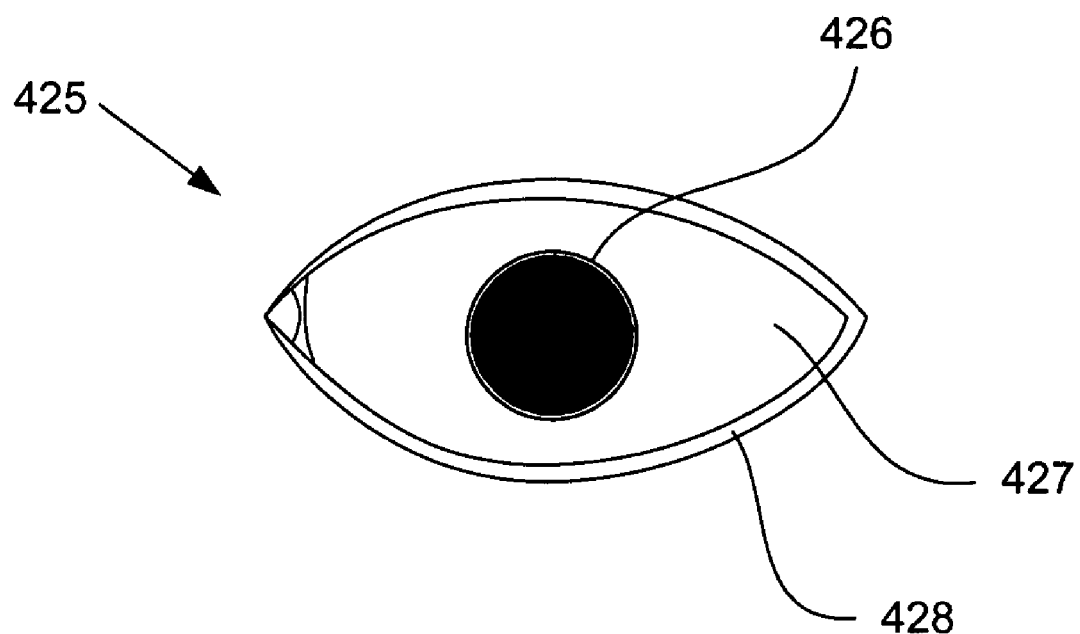
FIGS. 3C–D illustrate an animatronic eye in accordance with one embodiment of the present invention.
Figure 3D:
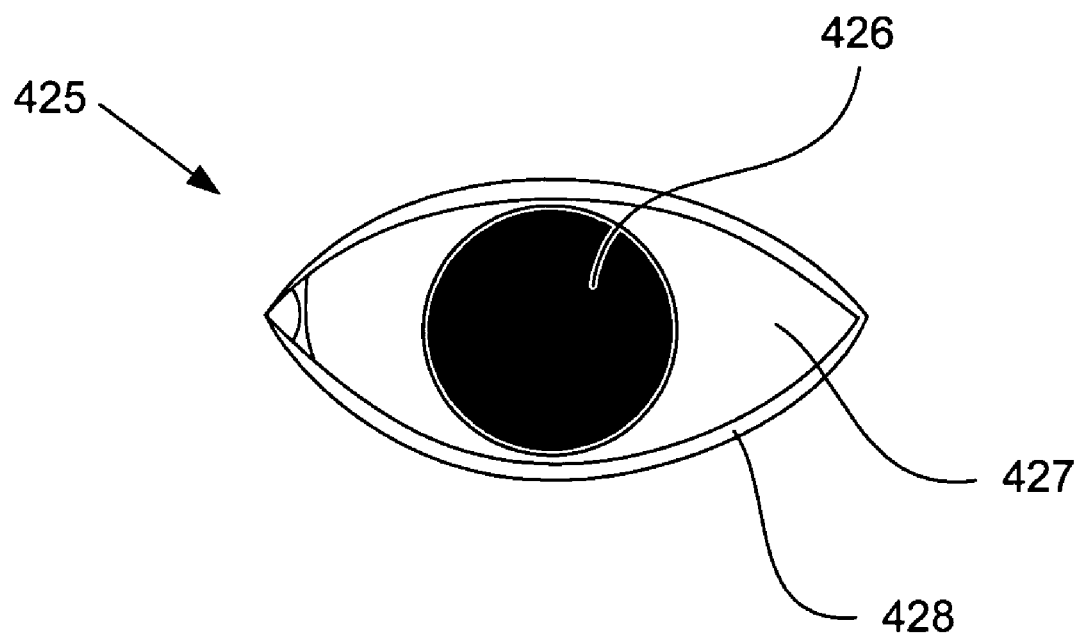

Additional humanlike motions may be applied to the face 400 using other animatronic devices used in conjunction with face 400. FIGS. 3C–D illustrate an animatronic eye 425 in accordance with one embodiment of the present invention. Eye 425 is a planar transducer having electrodes 426 patterned on opposite sides of polymer 427. Polymer 427 is attached on its perimeter to a frame 428. Frame 428 allows attachment to the inner surface of polymer 402 of face 400 in regions 424 near each eye. Eye 425 need not be flat. In another embodiment, eye 425 comprises a polymer stretched over a convex surface. The surface may be a slippery material that allows polymer 427 to slide over it. A lubricant may also be disposed between polymer 427 and the convex surface. A suitable lubricant might be a petroleum oil in the case of acrylic materials. This approach could also be used in allowing many of the facial motions described above to move over a convex surface rather than operate in at a flat plane.

Electrodes 426 cover a central circular portion of polymer 427, are dark and opaque, and thus resemble a human eye pupil. Actuation using electrodes 426 (attached on both sides of the film) causes polymer 427 in the region of electrodes 426 to expand in the plane. Electrodes 426 change shape with polymer 427. Thus, planar expansion of polymer 427 increases the darkened surface area of electrodes 426 and simulates dilation of a pupil, as illustrated in FIG. 3D. Portions of the polymer 427 outside the active area corresponding to electrodes 426 provide a contractile resistance to actuation. To enhance aesthetic appeal, polymer 427 material not covered by electrodes 426 may be colored white. When used with face 400, dilation and contraction of the electrodes 426 may be used to contribute to the simulation of human emotions by face 400. For example, actuation of eye 425 may be in conjunction with actuation of actuators 404a and 404b to simulate surprise for face 400.

Figure 3E:
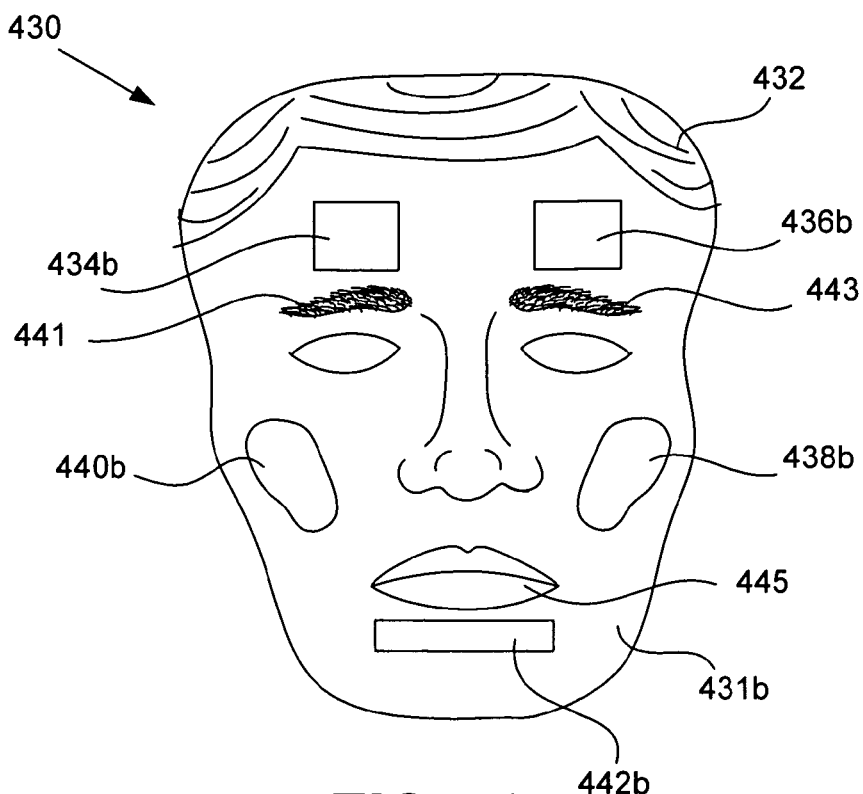
FIGS. 3E–F illustrate an animatronic face in accordance with another embodiment of the present invention.
Figure 3F:
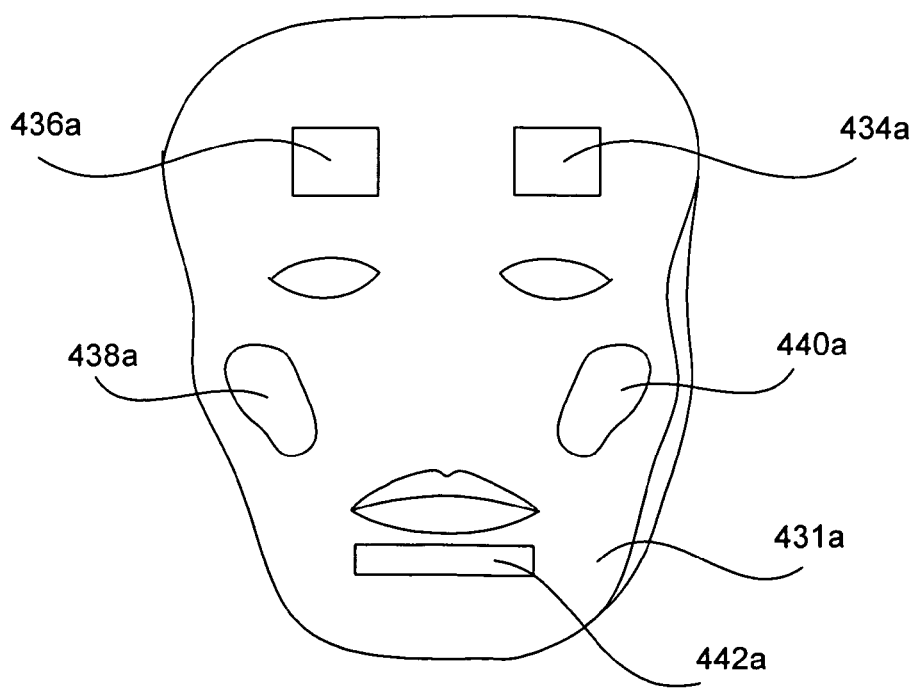

FIGS. 3E–F illustrate front and back perspective views, respectively, of animatronic face 430 in accordance with another embodiment of the present invention. Face 430 comprises a monolithic transducer including polymer 432 and electrode pairs 434, 436, 438, and 442 attached to outer and inner surfaces 431a and 431b of polymer 432 (e.g., 434a on inner surface 431a and 434b on outer surface 431b). Thus, polymer 432 is a monolithic polymer comprising four active areas that provide independent deflections and motions for the face 430. Polymer 431 comprises silicone rubber that is molded into a shape that provides the outer aesthetic appearance for face 430. In one embodiment, polymer 432 is relatively thin and has a thickness in the range of about 0.020 to about 0.10 millimeters.

Each electrode pair 434, 436, 438, 440, and 442 is responsible for actuation of a separate portion of the polymer 431 to produce motion for a separate feature for face 430. Actuation of electrode pair 434 moves right (FIG. 3E) eyebrow 441 down. Actuation of electrode pair 436 moves left eyebrow 443 down. Actuation of electrode pair 442 closes mouth 445. When electrical energy is removed from electrode pairs 434, 436, and 442, elastic return of polymer 432 returns each feature 441, 443, and 445 to its resting position before actuation. Electrode pairs 438 and 440 are patterned on the right and left cheek areas of face 430, respectively, to provide active areas that expand out of the plane similar to the monolithic diaphragm actuator described in FIGS. 2F and 2G. Actuation of the active area 438 may be used to simulate the bulging of the right cheek for face 430. Actuation of the active area 442 may be used to simulate the bulging of the left cheek. In one embodiment, a swelling agent such as a small amount of silicone oil is applied to the inner side 431b of polymer 431 to influence outward expansion of polymer 431. As one skilled in animatronics will appreciate, electrodes may be arranged on polymer mold 432 in a variety of ways to established desired skin deformations, provide controlled facial expressions, and convey emotions for face 430.

Electrode pairs 434, 436, 438, 440, and 442 are arranged with separate electrical communication. Independence of the electrode pairs allows electrical energy to be separately supplied to different portions of the polymer; thus allowing independent control for each of the active areas. Independent control may include deflection at different times, rates, and degrees of deflection. In another embodiment, two or more electrodes for face 430 are electrically coupled, e.g., electrode pairs 434 and 436 to allow for common actuation of eyebrows 441 and 443.

The electroactive polymer 432 exploits the flexibility of the electroactive polymer material as well as the ability to fabricate structures with high degrees of freedom by patterning multiple electrode pairs on a single polymer. In one embodiment, electrode pairs are patterned on polymer mold 432 to simulate facial features and facial muscle of a human. These simulated facial muscles may then be used to provide motion for features of the face 432 that simulates human facial movements. As one of skill in the art will appreciate, there are an abundant number of facial features, facial muscles, facial movements, and facial expressions that may be simulated using individual or multiple dedicated active areas on an electroactive polymer.

While the face 430 is illustrated as having a symmetrical appearance, it is understood that animated faces and devices of the present invention may comprise multiple active areas having a non-symmetrical and custom geometries. It is also understood that active areas may be combined in any configuration. These custom geometry active areas and configurations may be used, alone or a combination, to produce any custom two-dimensional deflection. In some cases, two active areas responsible for motion of separate features may be actuated together to provide movement for a separate portion of face 430 not specifically associated with the features associated with each of the active areas. For example, simultaneous actuation of electrode pairs 434 and 436 may also cause polymer material between the active areas in the central forehead region 439 to raise with eyebrows 441 and 443. It is also contemplated that elastic return may be used to provide controlled deflection. Similar to simultaneous actuation, elastic return of one portion of the polymer 432 corresponding to first active area may be combined with actuation of a second active area to provide a specialized movement for face 430, e.g., to provide movement for a separate portion of face 430 not specifically associated with the features associated with each of the active areas In one embodiment, polymer 432 is substantially thin and flexible, and may be attached conformably to solid structures having flat and curved surfaces as if polymer 432 is an external skin. Face 430 then takes the shape of the structure that it is fixed to. Non-fixed portions are then be capable of motion as determined by active areas arranged on polymer 432. As described above, face 430 may be partially attached to a convex surface that allows motion for features communicating with an electroactive polymer transducer. The convex surface would then allow for non-linear motion of the flexible polymer 432 about the convex surface. As illustrated in FIGS. 3E–F, electrode pairs are deposited on both sides, outward and hidden, of face 430. To hide opaque or unsightly electrode pairs on the outside and showing surface of the face 430, a cosmetic outer skin may cover the face 430. The outer cosmetic skin may be made of polyurethane, pigmented silicone rubber or natural latex rubber, for example. In another embodiment, the outer surface of polymer 432 is painted to hide the outer electrodes.

Figure 3G:
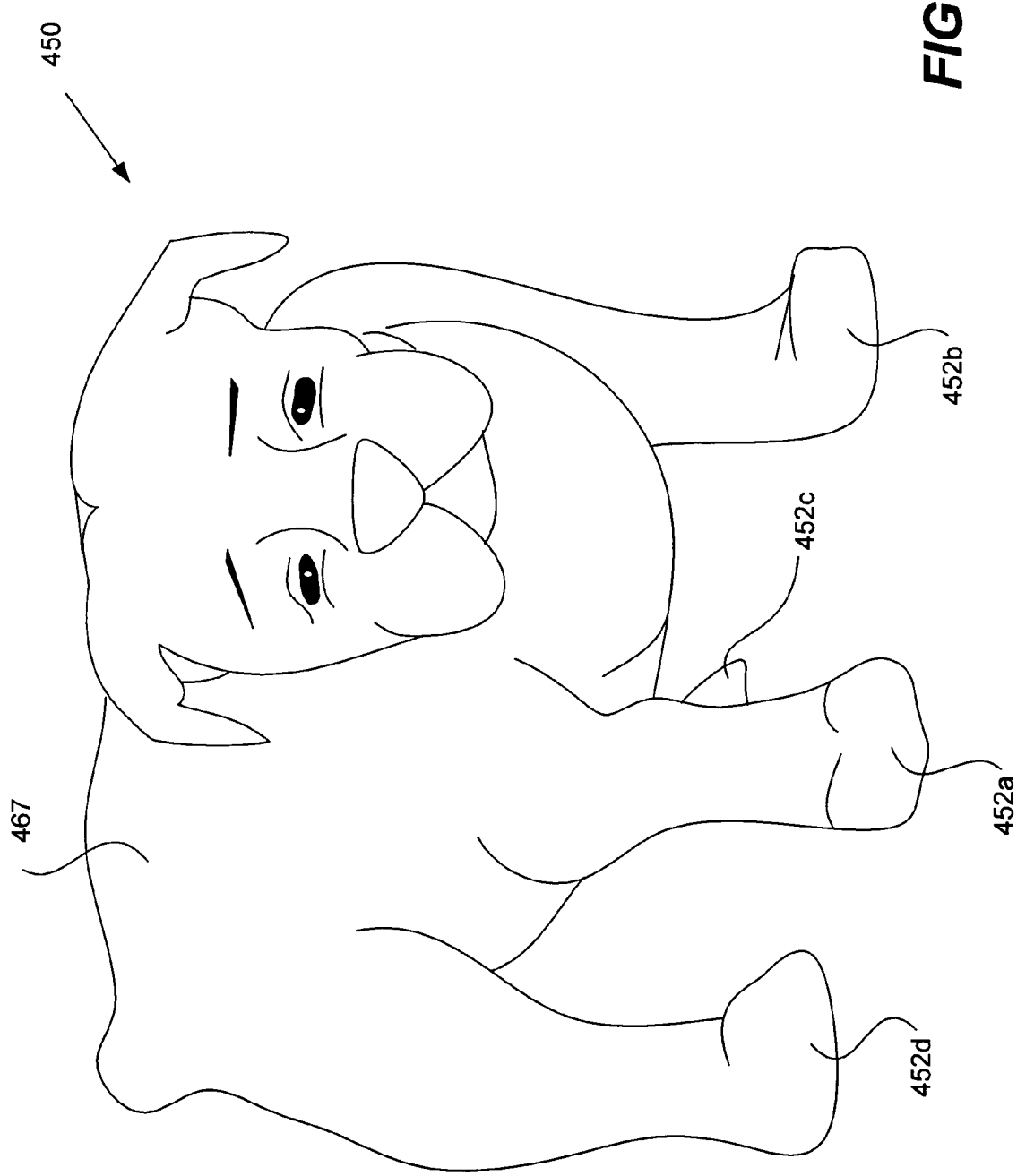
FIG. 3G illustrates a toy dog in accordance with one embodiment of the present invention.

In another aspect, electroactive polymer transducers of the present invention are used in toys. FIG. 3G illustrates a top perspective view of toy dog 450 in accordance with one embodiment of the present invention. Frame 465 (FIG. 3H) provides structural support for dog 450. Skin 467 is attached to frame 465 and provides an outer cover that protects internal components and provides an aesthetic appearance. Dog 450 is capable of legged surface based locomotion and includes four leg assemblies 452a–d powered by one or more electroactive polymer transducers.

FIG. 3H illustrates a cutaway side view of leg assembly 452a showing the leg assembly inside skin 467 in accordance with a specific embodiment of the present invention. Leg assembly 452a is a two degree of freedom structure having a first-degree freedom about pin 453 and a second degree of freedom about pin 454. Pin 453 is fixed to frame 465 of toy dog 450.

A first transducer 455 operates against a bias spring 456 to provide rotational motion between lower member 461 and upper member 463 of leg assembly 452a. Transducer 455 is a linear transducer rotably coupled to a central portion of lower member 461 at one end and rotably coupled to a central portion of upper member 463 at its opposite end. Bias spring 456 provides a counterclockwise bias force for leg 457 about pin 454 that maintains a resting position for leg 457 when transducer 455 is not actuated. As shown, actuation of transducer 455 rotates the lower member 461 of leg 457 clockwise about pin 454 to push lower member 461 down. When electricity is removed from transducer 455, elastic energy stored in bias spring 456 rotates lower member 461 counterclockwise and returns leg 457 to its resting position.

A second transducer 459 operates against a bias spring 450 to provide rotational motion between the upper member 463 of leg assembly 452a and frame 465. Transducer 459 is a linear transducer rotably coupled to a central portion of upper member 463 and rotably coupled to frame 465 at its opposite end. As shown, actuation of transducer 459 rotates upper member 463 clockwise about pin 453 to move leg 457 backwards. When electricity is removed from transducer 459, elastic energy stored in bias spring 450 moves leg 457 forward and returns leg 457 to its lateral resting position.

Together, transducer 455 and transducer 459 may be used to provide two degree of freedom motion for any part of lower member 461. Thus, transducers 455 and 459 may be used to contribute to a legged locomotion trajectory for a distal portion of leg 457. Leg assembly 452a may then be used in combination with other similar leg assemblies to provide a legged locomotion for dog 450. For example, electrical energy is removed from transducer 455 to pick lower member 461 up, and electrical energy is removed from transducer 459 to move lower member 461 and upper member 463 forward. In this case, elastic energy stored in springs 450 and 456 moves the distal end of leg 457 forward by rotating upper member 463 about pin 453 and lower member 461 about pin 454. At some point during forward displacement of leg 457, electrical energy is provided to transducers 459 and 455, bringing the distal portion of leg 457 down. Electrical energy may be provided either simultaneously or separately to provide a specific trajectory for the distal portion of leg 457. Leg 457 also includes padding 458 at its distal end attached to lower member 461. Padding 458 provides a compliant and larger area of contact with a surface that dog 450 is traversing to assist legged locomotion.

Although leg assembly 452a disk illustrated with transducers 459 and 455 providing clockwise rotation for their respective leg members about the pin joints as shown, it is understood that transducers 459 and 455 may each be oppositely coupled to their respective leg members in order to provide counterclockwise rotation for actuation of each transducer. In this case, activation of the polymer provides rotation in the opposite direction. One of skill in the art will appreciate that there are numerous trajectories that the distal end 461 can take in legged locomotion such as trajectories associated with walking, trotting, and running, for example. In a specific embodiment, springs 450 and 456 supply a constant force for deflection about each pin. Deflection about each pin may then follow a constant energy path to provide an energy efficient method for legged locomotion of dog 450. Deflection of an electroactive polymer using a constant energy path is described in further detail in commonly owned, pending U.S. patent application Ser. No. 09/779,373, which is incorporated by reference for all purposes.

Each transducer 455 and 459 is driven by a dc-dc converter with a maximum output of 5 kV and 500 mW of power. A dc-dc converter suitable for use with transducers 455 and 459 is model Q50 as provided by EMCO High Voltage of Sutter Creek, Calif. Actuation of transducers 455 and 459 may be initiated in a number of ways. In one embodiment, dog 450 includes a processor that coordinates actuation of transducers included in all four leg assemblies 452a–d. A processor, such as the PIC18C family of processors as provided by Microchip Technology Inc. of Chandler, Ariz., may be suitable to control each of the transducers 455 and 459 as well as their respective dc-dc converters. The processor may be coupled to a switch or a depressible push button which the user actuates by squeezing a portion of dog 450. Dog 450 may also include a battery or other electrical storage device enclosed within frame 465 that provides electrical energy to transducers 455 and 459 and the processor.

Figure 3I:
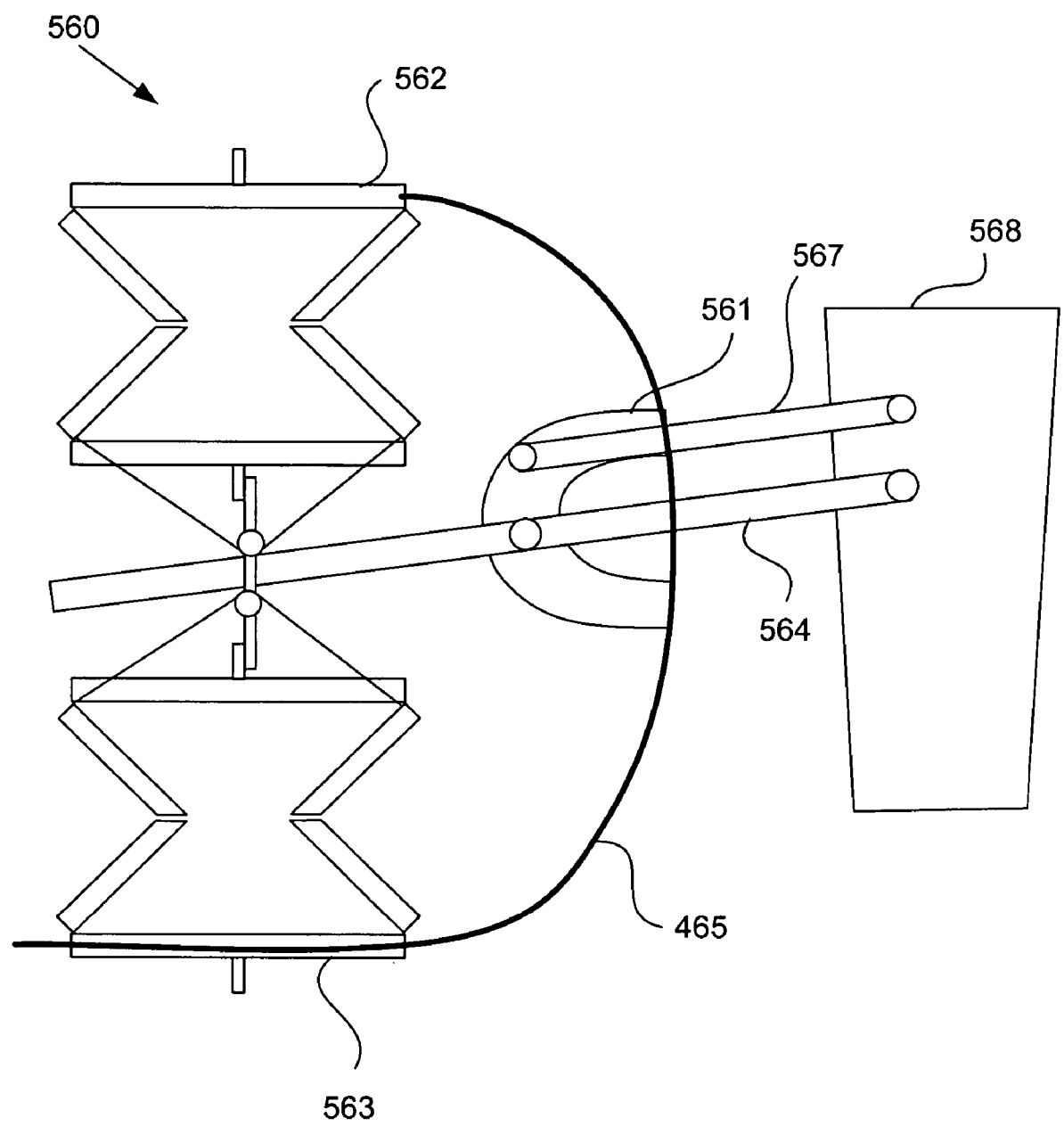
FIG. 3I illustrates leg assembly in accordance with another specific embodiment of the present invention.

FIG. 3I illustrates a leg assembly 560 in accordance with another specific embodiment of the present invention. Leg assembly 560 is a one degree of freedom structure having a rotational degree freedom about brace 561. Brace 561 provides fixed attachment to a frame 465. Transducer 562 actuates antagonistically against transducer 563. Both transducers 562 and 563 are attached at their proximate ends to member 564 and attached at their distal ends to frame 465. Member 564 rotates at its central portion 564a about brace 561 and has a free end 564b that is rotably coupled to leg 568. Member 567 provides torsional support for the leg assembly 560 and is rotably coupled at its proximate end to brace 561 and rotably coupled at its distal end to leg 568. Together, transducers 562 and 563 control the vertical position of leg 568. Leg assembly 560 may include another transducer that controls lateral displacement of leg assembly 560.

Figure 3J:
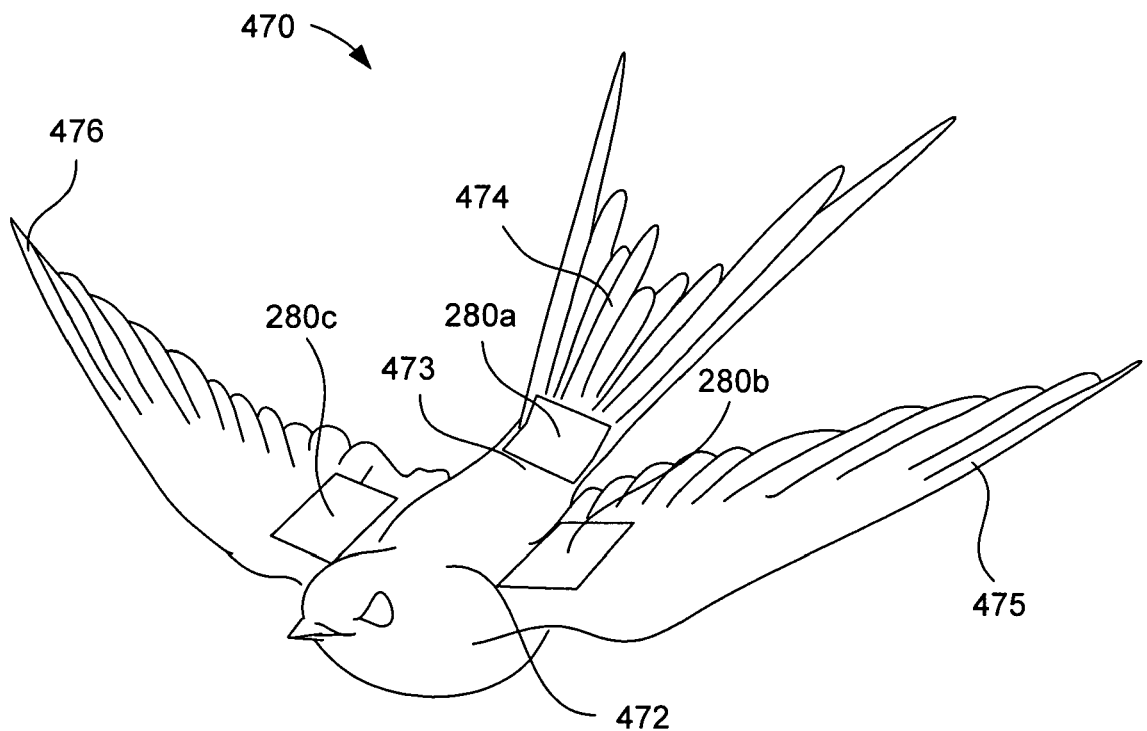
FIG. 3J–L illustrate a toy bird in accordance with another embodiment of the present invention.
Figure 3K:
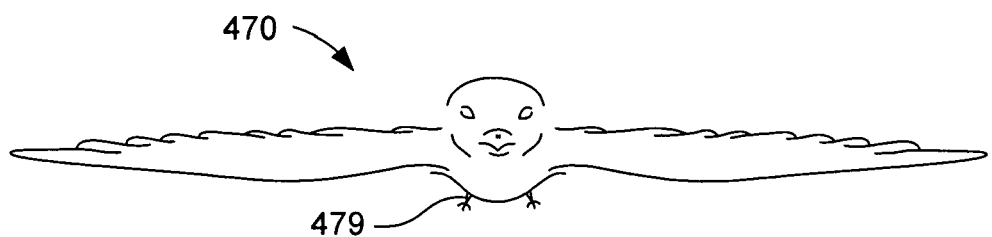
Figure 3L:
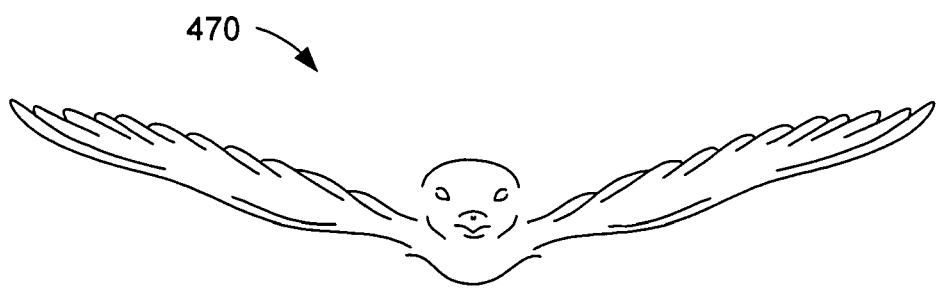

FIGS. 3J–L illustrate top perspective and front views of a toy bird 470 in accordance with another embodiment of the present invention. Bird 470 comprises a body 472 having a neck 471 and supports a pair of legs 479. Bird 470 also comprises several bending beam actuators 280a–c. Each bending beam actuator 280 is attached at their proximate end to body 472 and provides motion for a feature of bird 470 relative to body 472.

Deflection of bending beam actuator 280a rotates tail feathers 474 about a connection point 473 on body 472. Wings 475 and 476 are connected to distal ends of bending beam actuators 280b and 280c, respectively. In their resting position, wings 475 and 476 lie 180 degrees apart (FIG. 3K). Actuation of bending beam actuator 280b rotates wing 475 upward about body 472 (FIG. 3L). Actuation of bending beam actuator 280c rotates wing 476 upward about body 472. Thus, actuation of bending beam actuators 280b and 280c causes wings 475 and 476 to rotate upwards towards each other as illustrated in FIG. 3L.

When electricity is removed from the electrodes included in actuator 280b, elastic energy of the polymer included in the actuator returns wing 475 to its resting position. A similar elastic return occurs for actuator 280c and wing 476. Electrical energy may be repeatedly provided to actuators 280b and 280c to simulate flapping and flying for bird 470.

In another embodiment, a thin transducer, comprising an electroactive polymer and electrodes, covers one of the wings 475 or 476. The thin transducer is custom patterned monolithically according to simulate the shape of feathers for the bird 470. The transducer may then be used to reconfigure the shape of each wing according to the pattern of electrodes to simulate cruising and evasive motions of birds in flight.

Figure 3M:
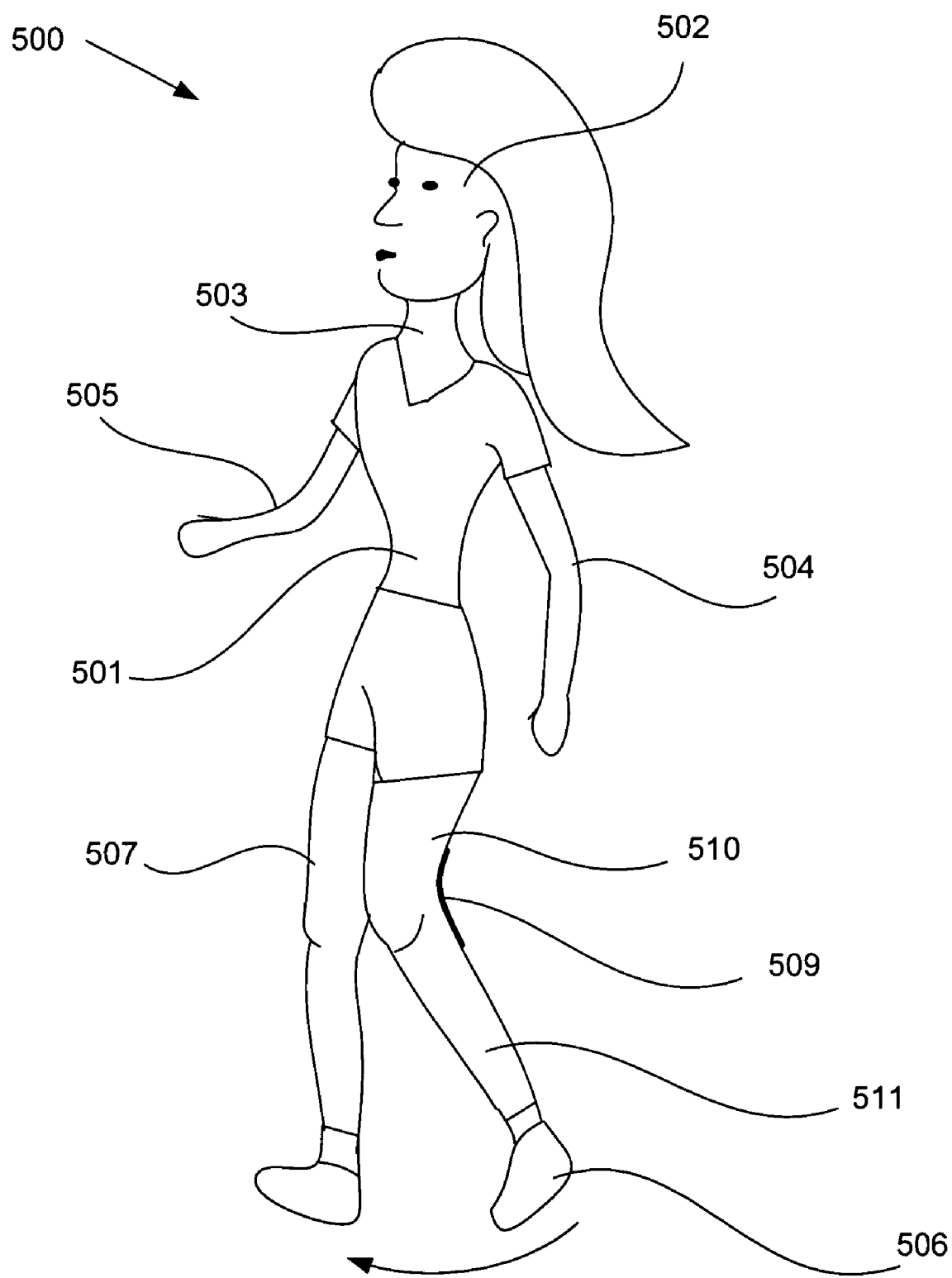
FIG. 3M illustrates a front perspective view of a toy doll constructed in accordance with another embodiment of the present invention.

FIG. 3M illustrates a front perspective view of a hand held toy doll 500 constructed in accordance with another embodiment of the present invention. Doll 500 includes a body comprising a unitary torso 501 having a neck 503 supporting a head 502. Torso 501 further supports a pair of arms 504 and 505 and a pair of legs 506 and 507. Arms 504 and 505 are passive. Preferably arms 504 and 505 are somewhat pivotal in their attachment to torso 501 such that a user is able to induce motion of arms 504 and 505.

Legs 506 and 507 are also somewhat pivotal in their attachment to torso 501 and each capable of user movement relative to torso 501 about the attachment. In addition, each leg 506 and 507 includes an electroactive polymer transducer that simulates kicking motion for doll 500. More specifically, transducer 509 is configured on the anterior side of leg 506 and attached at one end to thigh portion 510 of leg 506 and attached at its opposite end to lower leg portion 511. Actuation of transducer 509 causes lower leg portion 511 to rotate about knee joint 512, thus providing motion for leg 506. Doll 500 may be provided with a ball. A user, in conjunction with actuation of trasnducer 509, may use doll 500 to simulate kicking of the ball.

Actuation of transducer 509 may be initiated in a number of ways. In one embodiment, the transducer 509 is coupled to a depressible push button which the user actuates by squeezing a portion of doll torso 501. The transducer 509 and actuates when the depressible pushbutton is pushed or after the depressible pushbutton is released. In another embodiment, doll 500 includes a microphone and electric driving circuitry that allows voice activation of transducer 509. Doll 500 may also include a battery or electrical storage device enclosed within torso 501. Transducer 509 is driven by a control circuit and dc-dc converter with an output of 5 kV and 300 mW of power. A dc-dc converter suitable for use with transducer 509 is model Q50 as provided by EMCO High Voltage Inc. of Sutter Creek, Calif.

Doll 500 is intended to meet the need for more interactive hand held dolls as opposed to more sophisticated dolls that operate on their own. In contrast, one of skill in the art will appreciate that doll 500 may include numerous other electroactive polymer transducers that are processor controlled and designed to operate on their own without user assistance. Broadly speaking, one aspect of the present invention relates to articulated dolls including one or more electroactive polymer transducers. The dolls may be such devices employing an electroactive polymer that drives a movement feature—that is manually activated or processor activated. Toy dolls are a well known segment of the toy industry. Thus, dolls have been provided which vary from large "life size" dolls to small fashion dolls. Further variation is found in the material of dolls varying from soft so-called "plush" dolls to hand held hard plastic dolls and doll figures. By way of further variation, dolls may be provided that vary from simple dolls which have one or two moving features to dolls which are extremely active and able to perform various movements or activities.

While the doll 500 has been described specifically with respect to electroactive polymer transducers that provide motion that simulates kicking, it is understood that there a variety of other lifelike actions and movements that doll 500 may designed to simulate. Other exemplary lifelike actions whose movements an electroactive polymer transducer may contribute to simulation of include simulated skating action, liquid drinking action, swallowing action, smiling, arm waving, dancing, talking, throwing, blinking, burping, rolling over, etc. Lifelike movements that may be powered by an electroactive polymer transducer include may also any of those associated with the human actions listed above and any movements associated with a specific body part. Exemplary head 503 movements relative to torso 501 include nodding, twisting and universal movement of the head relative to the torso.

In general, toys in accordance with one aspect of the present invention include any toy that simulates motion of a living organism or a portion of an organism, such as hand held dolls, stuffed and plush toys, articulated action figures, action figure accessories, preschool learning toys, preschool talking & sound toys, mechanical design kits, robotic/virtual pets, etc. Each toy and may use one or more electroactive polymer transducers to provide motion for limbs, body segments, or appendages such as wings, antennae, etc. Toys of the present invention comprising one or more electroactive polymer transducers may include animated games. Exemplary animated games include those that use electroactive polymer transducers to direct static devices into motion for game purposes (e.g., to move a ball into a hole) and fighting toys having movements powered by one or more electroactive polymers and controlled by a user. As will be described in further detail below, transducers included in the fighting toys may also comprise electroactive polymer transducers with sensor capabilities.

One manner of classifying the large number of toys having motion powered by electroactive polymers of the present invention is by the type of motion produced by electroactive polymer. In one embodiment, electroactive polymer animated devices correspond to toys having surface based locomotion such as ground based and/or gravity-assisted locomotion powered by one more electroactive polymer transducers. Exemplary surface based types of locomotion include legged locomotion (bipedal, multiple legged, walking, trotting, crawling, running, etc), hopping (e.g., rabbits, frogs, kangaroos, etc.), wheeled locomotion (e.g., cars, trains, bicycles), and slithering (e.g., snakes, snails, slugs, etc.). Other exemplary types of locomotion include swimming (fish, eels, etc.) and flying, flapping and soaring (e.g. birds, butterflies, dragonflies, aircraft, etc.

In another embodiment, electroactive transducer powered toy has mobility independent from its user, e.g., wheeled vehicles such as trains and cars, legged animals such as dogs and dinosaurs, battery operated vehicles, electric/battery car sets & accessories, etc. In some cases, the devices may include remote control that controls actuation and deflection of an electroactive polymer. One of skill in the art will appreciate the abundant number of robotic toys that may be designed including electroactive polymer transducer and remote control.

An animated device that employs an electroactive polymer transducer may be considered a direct drive device where the transducer directly translates into motion of the feature. In many cases, back drivability associated with electroactive polymers included in a direct drive devices is desirable for an application. As the term is used herein, backdrivability refers to the ability to move a transducer against a direction of its actuation. Electroactive polymers typically have a low stiffness relative to their conventional electromechanical counterparts. More specifically, back drivability may be accomplished by overcoming the stiffness of the polymer during motion between a first position and a second position. This inherent low stiffness may provide a back drivability that is advantageous in some applications. For example, should an animated device in a theme park accidentally contact an object during motion, motion may be stopped by overcoming the stiffness of the polymer. As a result, the shock and initial force would typically be low relative to conventional electromechanical actuation, potentially reducing the amount of force experienced by the object. Thus, an animated device is in accordance with the present invention may be designed with a back drivability for motion of a feature between two positions. In one embodiment, the back drivability is accomplished by setting a maximum stiffness of polymer and device for motion of the feature between the first and second position.

In a specific embodiment, toys of the present invention comprise a feature that is back drivable. Since electroactive polymers are inherently compliant as discussed, back drivability for the toy may be accomplished by overcoming the stiffness of the polymer during motion between one position, e.g., a resting position, and a second position, e.g., a position of actuation. In addition, polymer material may be selected based on the back drivability requirements of an application. Polymer that is more compliant may add a larger compliance to the operation of an animatronic device by potentially reducing impact forces if an undesired collision occurs.

Animated Device Overview

Having briefly discussed several exemplary animated devices, some general aspects that may apply to animated devices of the present invention will now be discussed. In general, an animated device in accordance with the present invention comprises one or more electroactive polymers configured to provide motion for a feature of the device. The feature may be any portion of the device having motion at least partially contributed to by deflection (actuation or elastic return) of an electroactive polymer. There are an abundant number of animated device designs suitable for use with the present invention—including conventional animated devices retrofitted with one or more electroactive polymers and custom animated devices specially designed for electroactive polymer usage. Since many electroactive polymer transducers can operate well over a large range of sizes with little change in performance, electroactive polymer powered animated devices have many potential applications for both and large small devices.

An electroactive polymer may have customized deflections and strokes; thus permitting customized motions for a particular animated device. The use of multiple electroactive polymers in an animated device allows for the development of dextrous devices with numerous customized degrees of freedom. These customizable deflections and strokes also provide power without the need for complex transmission mechanisms such as cables and gears, resulting in lightweight actuation that is ideal for small, compact, and lightweight animated devices. Since no complex transmission mechanisms are needed, the remainder of the animated device is typically less complex and expensive than conventional forms of actuation.

The simplicity and high-efficiency of electrical to mechanical energy conversion provided by electroactive polymer transducers also allows improved animated devices in mobile and lightweight applications where available energy is limited. For example, mobile toys such as animated animals and remote control vehicles may benefit from the lightweight advantages of using an electroactive polymer transducer. Since the transducer is substantially lighter than a conventional electromagnetic motor, and the need for complex transmission mechanisms is removed for many devices, less demanding electrical energy storage devices are required. For example, the lighter weight gained by using an electroactive polymer transducer allows a smaller battery to be used or the same size battery may be used for a longer duration.

The present invention is also suitable for animated devices having a distributed transducer scheme. In a distributed transducer scheme, multiple links and transducers are used wherein each transducer drives a link directly, thus allowing a specific control for each link and therefore greater dexterity for the entire device. For example, an animatronic mannequin may have separate electroactive polymer transducers that power an upper arm, lower arm, wrist, and individual fingers. In this scheme, lightweight transducers are advantageous since a transducer is often required to move and support distal links that each include the added mass of a downlink transducer. One of skill in the art will appreciate the value of light weight in robotics, toys, and animatronics devices having multiple links.

A collection of electroactive polymers or actuators may be mechanically linked to form a larger actuator with a common output, e.g. force and/or displacement. By using a small electroactive polymer as a base unit in a collection, conversion of electric energy to mechanical energy may be scaled according to an application. By way of example, multiple linear motion devices 230 (FIG. 2C) may be combined in series in the direction 235 to form an actuator having a cumulative deflection of all the linear motion devices in the series. Electroactive polymer transducers and actuators— either individually or mechanically linked in a collection—may be referred to as 'artificial muscle'. For purposes herein, an artificial muscle is defined as one or more transducers and/or actuators having a single output force and/or displacement. Artificial muscles may be implemented on a micro or macro level and may comprise any one or more of the transducers and actuators described herein.

Given the customizable shape of electroactive polymers, animatronic devices using electroactive polymer transducers may then be designed to mimic any natural muscle based organism. Duplication of natural muscle thus allows electroactive polymer transducer powered animated devices to produce many natural motions and dynamics related to living organisms; and thus animated devices based on these organisms. For example, the large stroke capability of electroactive polymers allows them to be used directly as linear actuators in much the same way as muscle is used in biological animals, e.g., a biceps muscle. Further, the performance of electroactive polymer transducers is largely scale invariant, e.g., independent of size or mass. One can readily see the advantage of artificial muscle transducers in animatronic devices by noting the many conventional biological analogs to highly articulated animatronic devices that operate using muscular-like actuation. These include analogs such as fingers, hands, arms, legs, heads, limbs, body segments, wings, and appendages for a variety of insects and animals.

Animated devices of the present invention may also be designed and configured such that a mechanical property of a transducer substantially simulates a mechanical property of a real muscle. Exemplary mechanical properties that may be simulated by an electroactive polymer include stiffness, stroke, shape, strain, pressure, speed of response, efficiency, compliance, modularity (transducers may be stacked in parallel or linked in series) damping, and bulging in the middle as the muscle contracts. In one embodiment, electroactive polymer transducers are used to substantially simulate open loop or passive behavior of natural muscle. In this case, the transducers act as both a spring and damper in a passive manner similar to their natural counterparts.

Sensor Functionality

Animated devices of the present invention may also include a sensor. The sensor may sense a quantity or item included in the device and/or sense a quantity or item detected from the environment around the device. Quantities sensed may include haptic, acoustic, visual, or kinesthetic feedback, for example. In one embodiment, the sensor is a conventional sensor technology, e.g., a microphone or light sensor. In another embodiment, the sensor is an electroactive polymer transducer operating as a sensor.

FIGS. 1A and 1B may be used to show one manner in which the transducer portion 10 converts mechanical energy to electrical energy and acts as a sensor. If the transducer portion 10 is mechanically stretched by external forces to a thinner, larger area shape such as that shown in FIG. 1B, and a relatively small voltage difference (less than that necessary to actuate the film to the configuration in FIG. 1B) is applied between electrodes 14 and 16, the transducer portion 10 will contract in area between the electrodes to a shape such as in FIG. 1A when the external forces are removed. Once the transducer portion 10 is stretched, the relatively small voltage difference is provided such that the resulting electrostatic forces are insufficient to balance the elastic restoring forces of the stretch. The transducer portion 10 therefore contracts, and it becomes thicker and has a smaller planar area in the plane defined by directions 18 and 19 (orthogonal to the thickness between electrodes). When polymer 12 becomes thicker, it separates electrodes 14 and 16 and their corresponding unlike charges, thus raising the electrical energy and voltage of the charge. Further, when electrodes 14 and 16 contract to a smaller area, like charges within each electrode compress, also raising the electrical energy and voltage of the charge. Thus, with different charges on electrodes 14 and 16, contraction from a shape such as that shown in FIG. 1B to one such as that shown in FIG. 1A raises the electrical energy of the charge—which may be detected and measured by a circuit in electrical communication with the electrodes. That is, mechanical deflection is being turned into electrical energy and the transducer portion 10 is acting as a mechanical deflection sensor. Sensing performance of electroactive polymer is described in further described in commonly owned U.S. Pat. No. 6,809,462, which was previously incorporated by reference for all purposes. In one embodiment, a device may be configured such that sensing may be performed simultaneously with the actuation. In this case, a small amplitude high frequency signal may be superimposed on the driving signal. Circuitry may then measure the high frequency response of the polymer as an indication of the capacitance. Such techniques are well-known to those skilled in the art.

In a specific embodiment, an electroactive polymer transducer acts as a large capacitor. By measuring changes in capacitance, corresponding changes in polymer physical dimensions and force loading may be calculated. Thus, the transducer may be used to detect motion of a feature included in an animated device, e.g., an arm. In one embodiment, the same electroactive polymer transducer that provides mechanical output in an animated device also provides sensing capabilities. These transducers may then be made into "smart transducers" that intrinsically incorporate position, force, tactile sensing, etc. These smart transducers may simplify feedback control of mechanical output for an animated device, thus allowing for enhanced dexterity and controlled mechanical output.

In one embodiment, transducers of the present invention act as a haptic sensor for detecting touch. For example, transducer 432 of face 430 may be used to detect whether the face 430 is in contact with an object. Sensing contact may be advantageous for toys that provide an interactive and automatic response with a user. Force sensors, electroactive polymer based or other, may also be used to detect touch applied to the toy.

In another embodiment, transducers of the present invention act as kinesthetic interfaces. Since the transducers operate through a simple drive mechanism rather than a complex transmission, position and force measurements from the transducer may give a direct measurement of the position and loading on a feature included in an animatronic device.

In another embodiment, the animatronic eye of FIGS. 3C–3D is used in an optical sensor. In this case, electrode 426 has an opacity that varies with deflection. A transparent or substantially translucent polymer 427 is attached to the opacity varying electrode and deflection of the polymer 427 is used to modulate opacity of the eye. In the case of an optical switch, the opacity varying transducer interrupts a light source communicating with a light sensor. Thus, deflection of the transparent polymer 427 causes the opacity varying electrode to deflect and affect the light sensor (turn the switch on/off). In a specific embodiment, the opacity varying electrode includes carbon fibrils or carbon nanotubes that become less opaque as electrode area increases and the area fibril density decreases.

Interactive Capability

Animated devices of the present invention may also be interactive with their environment. Interactive abilities of the present invention refer to both automatic interaction and manual interaction.

In one embodiment, animated devices of the present invention include a processor. Combining the ability to design animated devices having customized motions, sensing abilities of electroactive polymer transducers and conventional sensors, and electrical communication with a processor, animated devices of the present invention may be programmed with automatic interactive capabilities.

In a specific embodiment, a stuffed toy comprises a processor that communicates independently with electrodes that actuate transducers in the toy. The toy may also comprise sensing capabilities that provide haptic, acoustic, visual, or kinesthetic information. The information is then provided to the processor, which is programmed to make decisions based on the feedback. In more elaborate designs, the sensor and processor may combine to make decisions based on context of the quantity being sensed. In a specific embodiment, electroactive polymer force sensors provide temporal and magnitude force information that a processor differentiates in order to provide interactive responses. For example, when a child user yanks on a stuffed toy, the processor receives the force information from the sensors and provides an acoustic signal to a transducer. The stuffed toy then interactively responds with an acoustic output of 'ouch' from the transducer.

In one embodiment, an animated device provides biomimetic responses to a person interacting with the device. As to term is used herein, a biomimetic response refers to response of a device that copies or mimics nature. For example, the stuffed toy just described may provide a suitable empathetic response based on feedback from a child. Thus, the sensors may sense a particular state of the child playing with the stuffed toy and then respond accordingly, e.g., the sensors detect sadness in the child using voice recognition and the processor responds by actuating facial transducers for the stuffed toy similar to mask 430 of FIG. 4C to produce an empathetic facial gesture. The biomimetic response may be selected to diffuse the state of the person, e.g., the sensors detect sadness in the child and the processor actuates electroactive polymer transducers in the device to provide a happy response including both happy facial gestures and an acoustic output. In this case, the stuffed toy is designed with electroactive polymer transducers that provide all movements associated with the appropriate empathetic responses required for interaction between the toy and person. This may include reactive eye movements, body language, facial gestures, acoustic output, etc. In another embodiment, animated devices for use in a theme park may be designed with biomimetic responses to a user.

In another embodiment, an animated device of the present invention provides tactile interaction with its environment. For example, one or more haptic sensors may be arranged under the skin in various places of the animated device. Each of the haptic sensors then detects touch for different body portion of the animated device. The same transducer may then be responsible for actuation in response to user interaction. For example, a haptic electroactive polymer sensor may be placed in the nose of the stuffed toy and the nose wiggles when touched (via actuation of the electroactive polymer). Alternatively, the stuffed toy may receive time varying force feedback from its environment and react accordingly. For example the stuffed toy previously discussed may be a teddy bear that reactively pushes back when its paw is pushed. In a more elaborate design, the magnitude of reactive push is proportional to the force magnitude pushing on the paw. In another embodiment, automatic toy interaction is designed not to stop an action based on sensor feedback. For example, a toy dinosaur with biting capabilities powered by electroactive polymer transducers uses force feedback from the transducers to decide when not to keep biting.

In another embodiment, an animated device has a set of responses based on a given input. For example, a toy dinosaur comprising a number of electroactive polymer transducers, a depressible button switch on its back, and a processor that responds to depression of the button, may have a series of programmed responses to depression of the button, e.g., locomotion and acoustic output. The depressible button may be an electroactive polymer transducer acting as a sensor or a simple conventional electrical switch in communication with the processor.

Interactive toys of the present invention need not include a processor. For the exemplary fighting men game mentioned above, an individual fighter in the game may include be designed with joint compliance that provides an automatic and appropriate response when hit by another fighter, e.g., the fighter falls down after being hit hard in the head by the other fighter. In this case, a user may provide manual control of the transducers in their corresponding motions for the toy fighter.

Additional Applications

As the present invention includes transducers that may be implemented in both the micro and macro scales, and with a wide variety of designs, the present invention finds use in a broad range of applications where animated motion is desired. Provided below are some additional exemplary applications for electroactive polymer transducer animated devices.

Animated devices of the present invention are also well-suited for use in the entertainment industry. Exemplary applications include animated device use in moving displays of theatre, theme parks, theme park rides, dark walks, scenery, and special effects for the film and television industries. Since downtime due to mechanical failure and repair is a nontrivial consideration for conventional animatronic devices in theme park rides, the simplicity and reliability electroactive polymers provide make them well-suited for this application. In many cases, fault tolerance may be built into an electroactive polymer based animatronic device included in theme park ride by using several smaller transducers in parallel, thus increasing reliability of the device and minimizing downtime of the ride.

One of skill in the art will appreciate the wide use of animatronics in entertainment special effects work. Some exemplary animated devices found in the entertainment industry suitable for use with electroactive polymer transducers include animatronic puppets, creatures and creature effects, sculptures, masks, special effects make-up, figures, prosthetics, props, scenic and set decorations, and character costumes. Exemplary creature effects include masked monsters, aliens, apes, dinosaurs, animatronic figures, etc. Special effects makeup include effects such as latex masks and devices added to a person, animal or other device, e.g., to appear if skin is bulging by putting a prosthetic on their skin and actuating it.

The present invention is also suitable for sporting animated devices. Exemplary sporting animated devices include decoys such as animated ducks used for attracting game and electroactive polymer transducer powered fishing lures. The decoys may also be used in animal and pest traps such as a flapping fly, crawling insect or wiggling worm or insect used in a pest trap, for example.

Animated devices of the present invention may also be used in medical training. This includes mannequins and training instruments that incorporate sensing and interactive capabilities. For example, a CPR training mannequin may include force sensors to detect the degree of chest expansion provided by a CPR trainee. In addition, the CPR training mannequin may include customized motions of a feature that provides interactive response based on CPR trainee performance, e.g., a diaphragm actuator that operates similar to actuator 130 of FIG. 2F and repeatedly actuates to simulate a pulse.

The present invention also finds use in novelty items that include animated motion. Exemplary novelty items suitable for use with present invention include singing fish, dancing flowers, Halloween and Christmas novelty items such as dancing Santas, etc.

Conclusion

While this invention has been described in terms of several preferred embodiments, there are alterations, permutations, and equivalents that fall within the scope of this invention which have been omitted for brevity's sake. By way of example, although the present invention has been described in terms of several numerous applied material electrodes, the present invention is not limited to these materials and in some cases may include air as an electrode. It is therefore intended that the scope of the invention should be determined with reference to the appended claims.

What is claimed is:

1. An animated toy comprising:
   a feature capable of motion between a first position and a second position; and
   a rolled electroactive polymer transducer either included in the feature or coupled to the feature and configured to provide at least a portion of the motion between the first position and the second position for the feature, the transducer comprising an active area, which includes at least two electrodes coupled to a portion of an electroactive polymer, the portion capable of deflection in response to a change in electric field provided by the at least two electrodes.

2. The toy of claim 1 wherein the polymer has an elastic modulus below about 100 MPa.

3. The toy of claim 1 wherein elastic return of the electroactive polymer provides at least a portion of the motion from the second position to the first position.

4. The toy of claim 1 wherein the rolled electroactive polymer is pre-strained.

5. The toy of claim 1 wherein the electroactive polymer has a maximum actuation pressure between about 0.05 MPa and about 10 MPa.

6. The toy of claim 1 wherein the rolled electroactive polymer transducer further comprises a second active area, said second active area comprising at least two second active area electrodes and a second portion of the rolled electroactive polymer coupled to the at least two second active area electrodes.

7. The toy of claim 6 wherein the first active area and the second active area are capable of independent actuation.

8. The toy of claim 7 wherein the rolled electroactive polymer transducer is configured to provide two-dimensional motion between a first position and a second position.

9. The toy of claim 8 wherein the rolled electroactive polymer transducer is configured to provide three-dimensional motion between a first position and a second position.

10. The toy of claim 1 wherein the device is backdrivable between the first position and the second position.

11. The toy of claim 10 wherein backdriving is accomplished by overcoming the stiffness of the polymer during motion between the first position and the second position.

12. The device of claim 1 wherein the device is capable of surface based locomotion.

13. The device of claim 12 wherein the first position and the second position are included in legged locomotive positions of a toy.

14. The device of claim 1 wherein motion between the first position and the second position for the feature has human likeness.

15. An animated toy comprising:
a feature capable of motion between a first position and a second position;
an electroactive polymer transducer either included in the feature or coupled to the feature and configured to provide at least a portion of the motion between the first position and the second position for the feature, the transducer comprising an active area, which includes at least two electrodes coupled to a portion of a rolled electroactive polymer, the portion capable of deflection in response to a change in electric field provided by the at least two electrodes;
an electroactive polymer sensor configured to detection the motion between a first position and a second position.

16. The toy of claim 15 wherein the electroactive polymer sensor is included in the electroactive polymer transducer.

17. The toy of claim 15 wherein the sensor provides one of haptic and force feedback.

18. The toy of claim 15 wherein the electroactive polymer is pre-strained.

19. The toy of claim 15 wherein the transducer further comprises a second active area, said second active area comprising at least two second active area electrodes and a second portion of the electroactive polymer coupled to the at least two second active area electrodes.

20. The toy of claim 15 wherein the polymer has an elastic modulus below about 100 MPa.

* * * * *

UNITED STATES PATENT AND TRADEMARK OFFICE
CERTIFICATE OF CORRECTION

PATENT NO. : 7,211,937 B2 Page 1 of 1
APPLICATION NO. : 11/411007
DATED : May 1, 2007
INVENTOR(S) : Kornbluh et al.

It is certified that error appears in the above-identified patent and that said Letters Patent is hereby corrected as shown below:

On the Title Page:

(60) Related U.S. Application Data

--After "Feb. 9, 2000" insert --, provisional application No. 60/273,108, filed on March 2, 2001--.

Signed and Sealed this

Twenty-fifth Day of November, 2008

JON W. DUDAS
*Director of the United States Patent and Trademark Office*